United States Patent
Colinge et al.

(10) Patent No.: US 10,008,566 B2
(45) Date of Patent: Jun. 26, 2018

(54) SEMICONDUCTOR DEVICE WITH REDUCED ELECTRICAL RESISTANCE AND CAPACITANCE

(71) Applicant: Taiwan Semiconductor Manufacturing Company Limited, Hsin-Chu (TW)

(72) Inventors: Jean-Pierre Colinge, Hsinchu (TW); Kuo-Cheng Ching, Zhubei (TW); Ta-Pen Guo, Cupertino, CA (US); Carlos H. Diaz, Mountain View, CA (US)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 94 days.

(21) Appl. No.: 14/025,041

(22) Filed: Sep. 12, 2013

(65) Prior Publication Data

US 2015/0069475 A1    Mar. 12, 2015

(51) Int. Cl.
*H01L 29/06* (2006.01)
*H01L 21/8234* (2006.01)
(Continued)

(52) U.S. Cl.
CPC .......... *H01L 29/0676* (2013.01); *B82Y 10/00* (2013.01); *B82Y 40/00* (2013.01);
(Continued)

(58) Field of Classification Search
CPC .......... H01L 29/0676; H01L 29/42392; H01L 29/775; H01L 29/66439; H01L 29/78642;
(Continued)

(56) References Cited

U.S. PATENT DOCUMENTS

| 4,530,149 A | * | 7/1985 | Jastrzebski | ............. H01L 21/28 257/E21.131 |
| 6,034,389 A | * | 3/2000 | Burns, Jr. | ......... H01L 27/10823 257/301 |

(Continued)

FOREIGN PATENT DOCUMENTS

| CN | 102832221 A | 12/2012 |
| JP | 2013-534058 | 8/2013 |

(Continued)

OTHER PUBLICATIONS

Gundapaneni, et al., "Enhanced Electrostatic Integrity of Short-Channel Junctionless Transistor With High-κ Spacers", IEEE Electron Device Letters, vol. 32, No. 10, Oct. 2011, pp. 1325-1327.

(Continued)

*Primary Examiner* — Tom Thomas
*Assistant Examiner* — Nilufa Rahim
(74) *Attorney, Agent, or Firm* — Cooper Legal Group, LLC

(57) ABSTRACT

A semiconductor device includes a first type region including a first conductivity type. The semiconductor device includes a second type region including a second conductivity type. The semiconductor device includes a channel region extending between the first type region and the second type region. The channel region is separated a first distance from a first portion of the first type region. The semiconductor device includes a gate region surrounding the channel region. A first portion of the gate region is separated a second distance from the first portion of the first type region. The second distance is greater than the first distance.

8 Claims, 25 Drawing Sheets

(51) Int. Cl.
*B82Y 10/00* (2011.01)
*B82Y 40/00* (2011.01)
*H01L 29/423* (2006.01)
*H01L 29/66* (2006.01)
*H01L 29/775* (2006.01)

(52) U.S. Cl.
CPC ........... *H01L 21/823487* (2013.01); *H01L 29/42392* (2013.01); *H01L 29/66439* (2013.01); *H01L 29/775* (2013.01); *Y10S 977/762* (2013.01); *Y10S 977/938* (2013.01)

(58) Field of Classification Search
CPC ........... H01L 29/7827; H01L 29/41741; H01L 21/823487; H01L 21/02603; B82Y 40/00; B82Y 10/00; Y10S 977/938; Y10S 977/762
See application file for complete search history.

(56) References Cited

U.S. PATENT DOCUMENTS

| | | | | |
|---|---|---|---|---|
| 6,406,962 B1* | 6/2002 | Agnello | ........... | H01L 21/84 257/E21.703 |
| 7,459,366 B2* | 12/2008 | Banerjee | ........... | H01L 29/0878 257/E21.41 |
| 2006/0273389 A1* | 12/2006 | Cohen | ........... | B82Y 10/00 257/331 |
| 2008/0173936 A1* | 7/2008 | Yoon | ........... | H01L 21/84 257/329 |
| 2009/0020764 A1* | 1/2009 | Anderson et al. | ........... | 257/77 |
| 2010/0019276 A1* | 1/2010 | Jang | ........... | 257/190 |
| 2010/0078698 A1* | 4/2010 | Son | ........... | B82Y 10/00 257/296 |
| 2011/0068418 A1* | 3/2011 | Lung | ........... | B82Y 10/00 257/413 |
| 2012/0001249 A1* | 1/2012 | Alsmeier | ........... | H01L 27/11551 257/319 |
| 2012/0319201 A1 | 12/2012 | Sun et al. | | |
| 2013/0095623 A1* | 4/2013 | Guo | ........... | H01L 29/4983 438/268 |
| 2013/0175604 A1* | 7/2013 | Polishchuk | ........... | H01L 29/792 257/325 |
| 2013/0248974 A1* | 9/2013 | Alsmeier | ........... | G11C 16/04 257/321 |
| 2013/0341702 A1* | 12/2013 | Kar et al. | ........... | 257/324 |
| 2014/0166981 A1* | 6/2014 | Doyle et al. | ........... | 257/24 |
| 2014/0203353 A1* | 7/2014 | Masuoka | ........... | H01L 29/7827 257/329 |
| 2015/0325665 A1* | 11/2015 | Masuoka | ........... | H01L 21/823431 257/329 |

FOREIGN PATENT DOCUMENTS

| | | |
|---|---|---|
| KR | 20100011559 A | 2/2010 |
| KR | 1020120139067 | 12/2012 |
| KR | 10201330017452 | 2/2013 |
| TW | 201306178 | 2/2013 |
| WO | 2012003301 A1 | 1/2012 |
| WO | 2011101107 A1 | 8/2012 |
| WO | 2012101107 A1 | 8/2012 |

OTHER PUBLICATIONS

Lee, et al., "Performance estimation of junctionless multigate transistors", Solid-State Electronics 54, Apr. 24, 2009, (2010) 97-103, journal homepage: www.elsevier.com/locate/sse.
Sakui, et al., "A new vertical MOSFET "Vertical Logic Circuit (VLC) MOSFET" suppressing asymmetric characteristics and realizing an ultra compact and robust logic circuit", Solid-State Electronics 54 (2010) 1457-1462, www.elsevier.com/locate/sse.
Lee, et al., "Short-Channel Junctionless Nanowire Transistors", pp. 2, 2010, http://www.nanofunction.eu/data/document/latenews.pdf.
Corresponding Korean Application, Korean Office action dated Nov. 18, 2015, 13 pages.
Corresponding Taiwan Application 10521397860, Taiwan Office action dated Nov. 14, 2016, 5 pages.
Corresponding Korean application No. 10-2014-0100469, Korean Office action dated Jan. 26, 2017, 5 pages.
Corresponding Chinese Application 201410300267.2, Chinese Office action dated Dec. 28, 2016, 5 pages.
Corresponding Korean Application Notice of Allowance dated Sep. 12, 2017 (8 pgs).

* cited by examiner

SEMICONDUCTOR DEVICE WITH REDUCED ELECTRICAL RESISTANCE AND CAPACITANCE

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques, and resulting structures, for forming a semiconductor device are provided herein.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
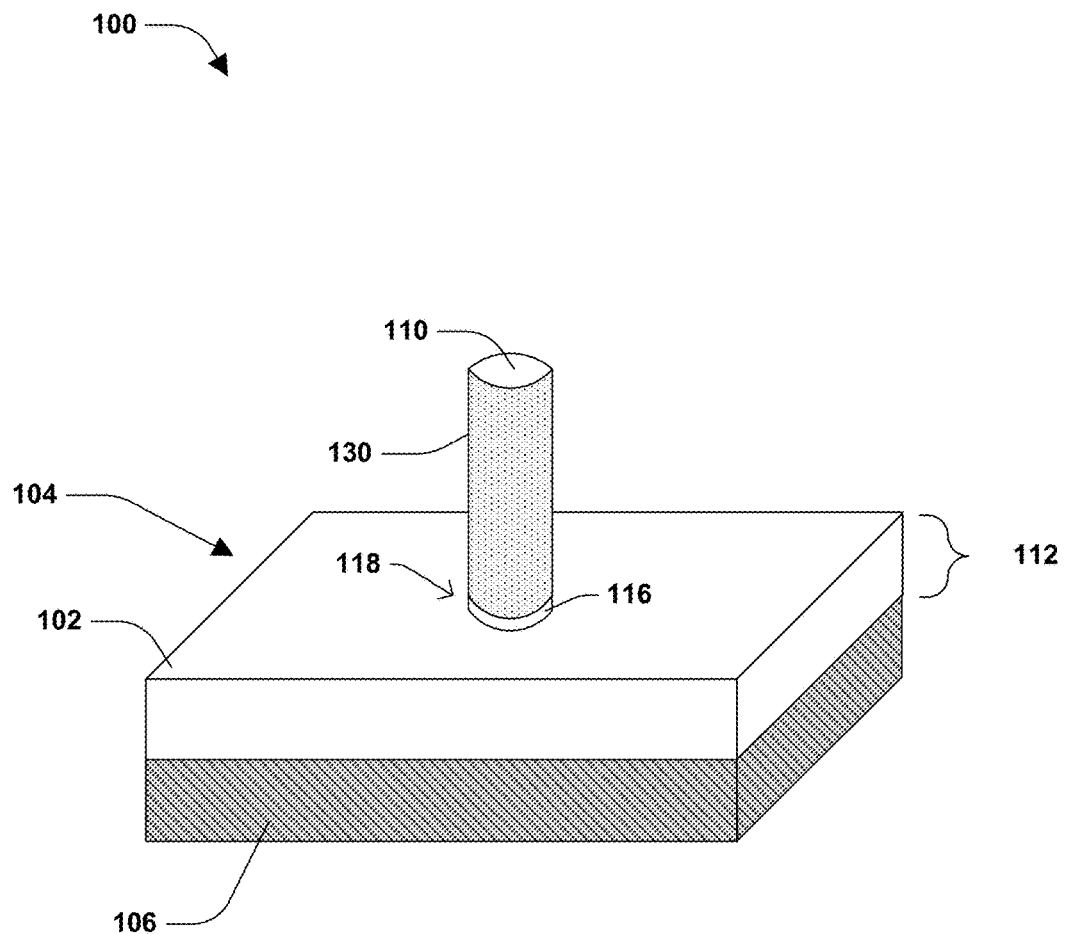
FIG. 1 illustrates a portion of a semiconductor device, according to an embodiment.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor device and resulting structures formed thereby are provided herein.

FIG. 1 is a perspective view illustrating a portion of a semiconductor device 100 according to some embodiments. In an embodiment, the semiconductor device 100 is formed upon a doped region 102. According to some embodiments, the doped region 102 is doped to form a first type region 104. In some embodiments, the doped region 102 comprises a p-type diffusion. In some embodiments, the doped region 102 comprises an n-type diffusion.

In some embodiments, a first portion 112 of the first type region 104 is formed by doping the doped region 102. In an embodiment, the first type region 104 comprises a first conductivity type. In some embodiments, the first conductivity type of the first type region 104 comprises a p-type material, p+ type material, p++ type material, p-type dopants such as Boron, Gallium, Indium, etc., alone or in combination. In some embodiments, the first conductivity type of the first type region 104 comprises an n-type material, n+ type material, n++ type material, n-type dopants such as Phosphorous, Arsenic, Antimony, etc., alone or in combination. In some embodiments, the first type region 104 comprises a source region. In some embodiments, the first type region 104 comprises a drain region.

According to some embodiments, the doped region 102 is formed on or within a substrate region 106. The substrate region 106 comprises any number of materials, such as, for example, silicon, polysilicon, germanium, SiGe, III-V semiconductors, etc., alone or in combination. According to some embodiments, the substrate region 106 comprises an epitaxial layer, a silicon-on-insulator (SOI) structure, wafer, die formed from a wafer, etc. In some embodiments, the substrate region 106 comprises a different polarity or conductivity type than the first portion 112 of the first type region 104.

In an embodiment, the semiconductor device 100 comprises one or more nanowires 110. According to some embodiments, the nanowire 110 projects from the first type region 104. The nanowire 110 comprises any number of materials such as, for example, silicon, polysilicon, germanium, SiGe, III-V semiconductors, etc., alone or in combination. In some embodiments, a second portion 116 of the first type region 104 is formed at a first end 118 of the nanowire 110. In an embodiment, the second portion 116 of the first type region 104 is formed by diffusion from the first portion 112 of the first type region 104.

In some embodiments, a channel region 130 is formed, such as by doping the nanowire 110. In some embodiments, the channel region 130 is formed by a tilted or angled doping process, in which dopants are imparted to the nanowire 110 at a non-vertical angle relative to a top surface of the substrate 106 or doped region 102 from which the nanowire projects. In some embodiments, the channel region 130 extends between the first type region 104 and a second type region (illustrated in FIG. 9). In an embodiment, the channel region 130 is comprised within a vertical nanowire 110.

According to some embodiments, the channel region 130 comprises a third conductivity type. In some embodiments, the third conductivity type of the channel region 130 comprises a p-type material, p+ type material, p++ type material, p-type dopants such as Boron, Gallium, Indium, etc., alone or in combination. In some embodiments, the third conductivity type of the channel region 130 comprises an n-type material, n+ type material, n++ type material, n-type dopants such as Phosphorous, Arsenic, Antimony, etc., alone or in combination.

Figure 2:
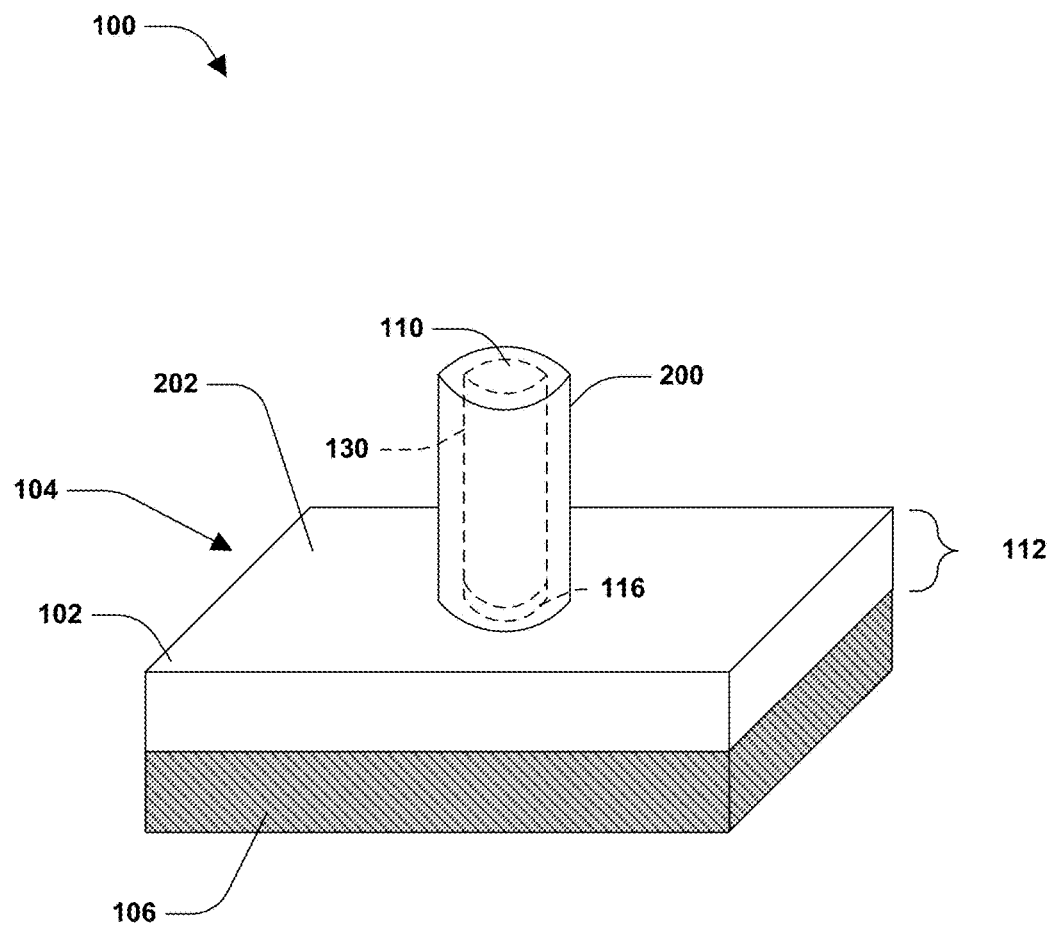
FIG. 2 illustrates a portion of a semiconductor device, according to an embodiment.

Turning to FIG. 2, in an embodiment, a spacer 200 is formed surrounding at least one of the second portion 116 of the first type region 104 or the channel region 130 of the nanowire 110. In some embodiments, the spacer 200 comprises a dielectric material, such as nitride, oxide, etc., alone or in combination. The spacer 200 is formed in any number of ways, such as by thermal growth, chemical growth, atomic layer deposition (ALD), chemical vapor deposition (CVD), plasma-enhanced chemical vapor deposition (PECVD), or other suitable techniques, for example. In some embodiments, the spacer 200 is etched, such that a top surface 202 of the first portion 112 of the first type region 104 and a top end of the nanowire 110 are substantially not covered by material used to form the spacer 200.

Figure 3:
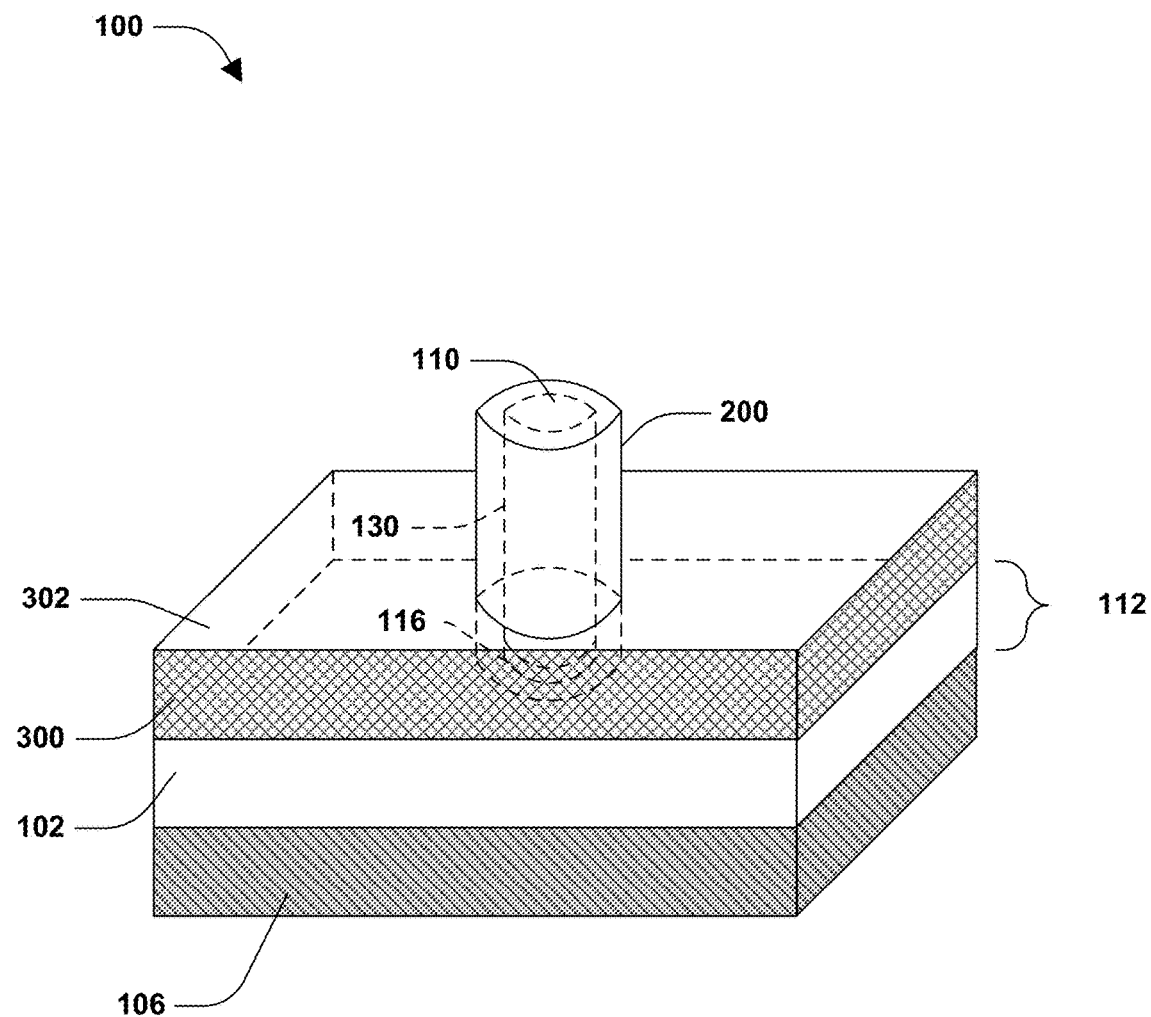
FIG. 3 illustrates a portion of a semiconductor device, according to an embodiment.

Turning now to FIG. 3, according to some embodiments, a first insulator layer 300 is formed over the first portion 112 of the first type region 104 and around the spacer 200. The first insulator layer 300 is formed in any number of ways, such as by deposition, chemical vapor deposition (CVD), or other suitable methods, for example. The first insulator layer 300 includes any number of materials, including oxides, silicon oxide, nitrides, silicon nitride, oxynitrides, $SiO_2$, etc., alone or in combination. In some embodiments, a top surface 302 of the first insulator layer 300 is substantially planar.

Figure 4A:
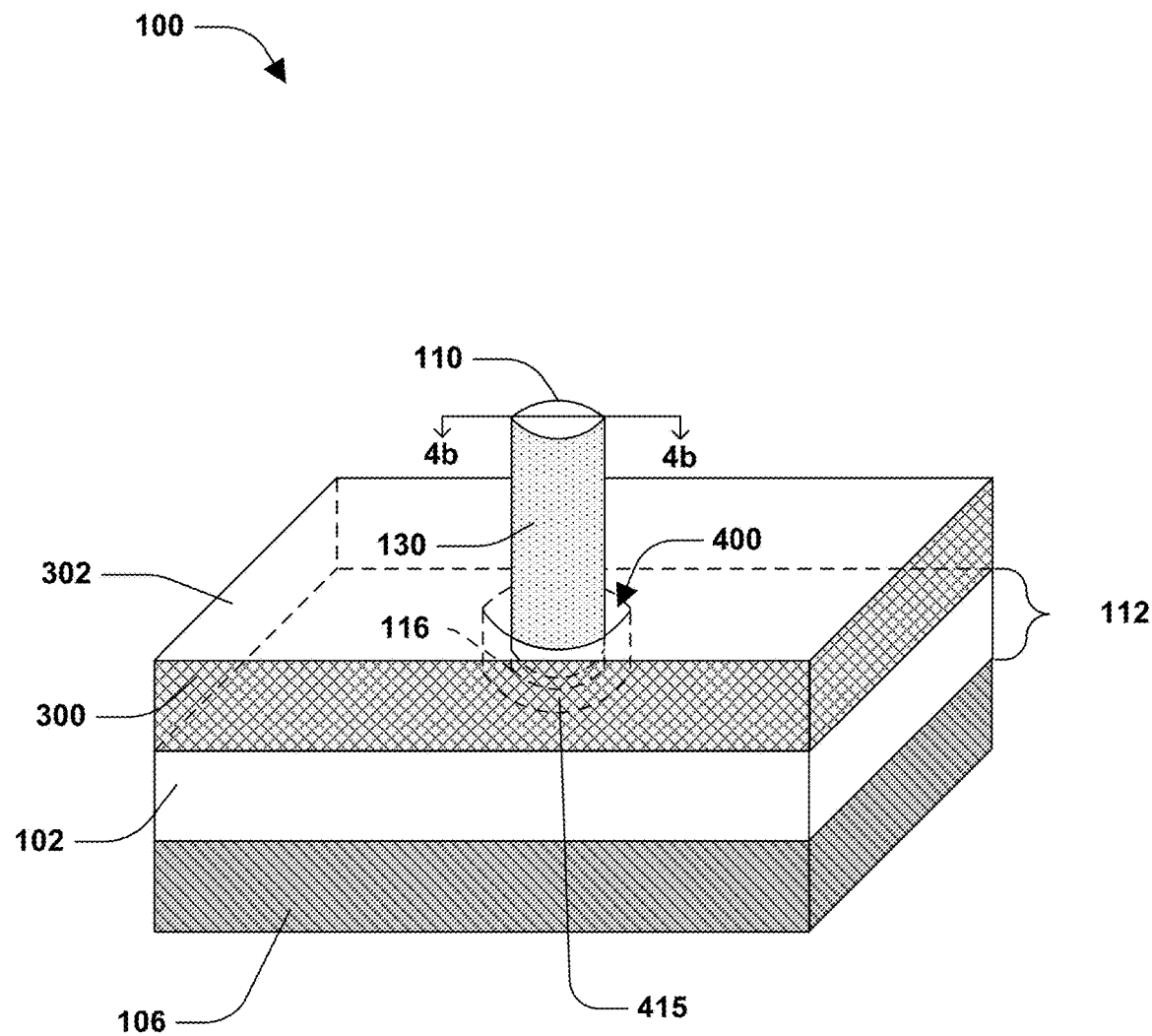
FIG. 4a illustrates a portion of a semiconductor device, according to an embodiment.
Figure 4B:
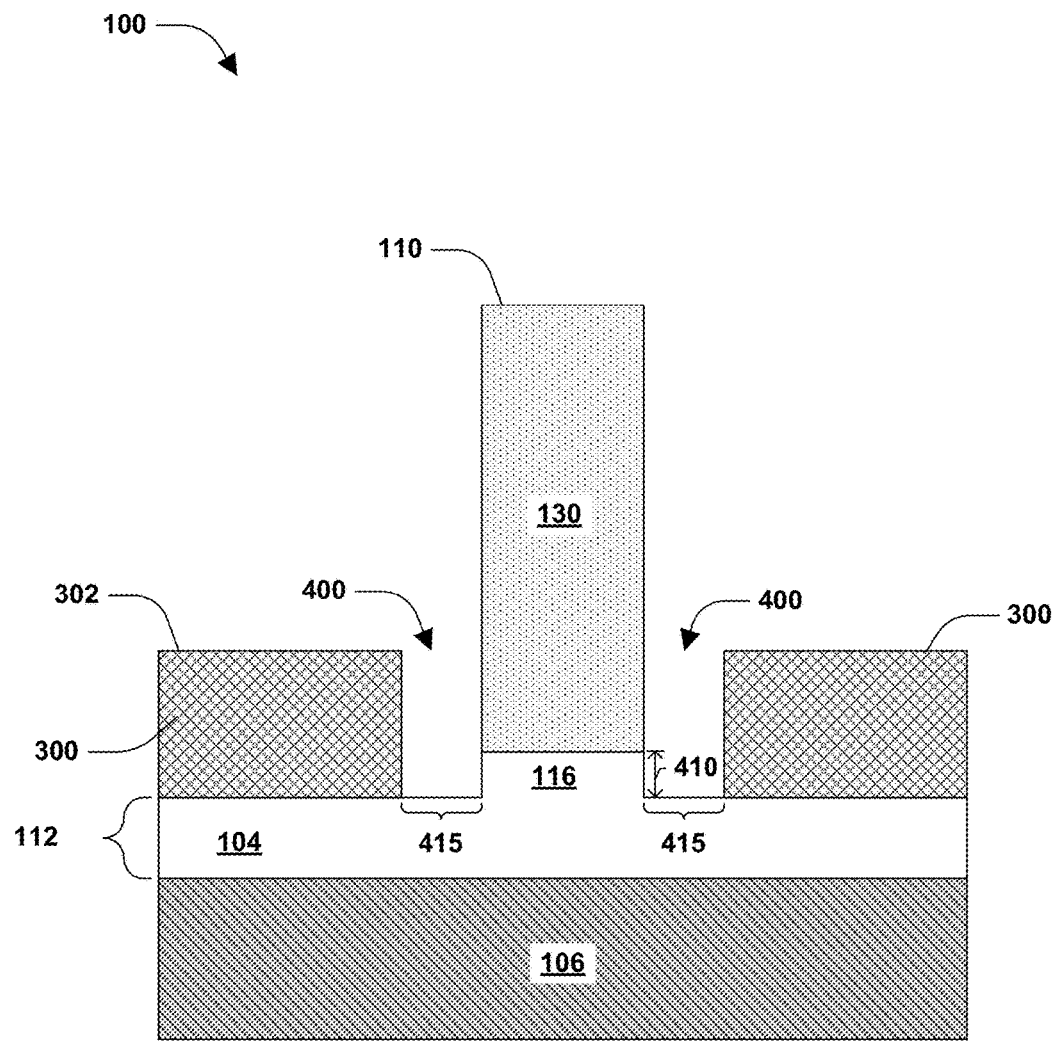
FIG. 4b illustrates a portion of a semiconductor device, according to an embodiment.

Turning now to FIG. 4a, in an embodiment, the spacer 200 is removed. FIG. 4b is a cross-sectional view of the embodiment of FIG. 4a taken along lines 4b-4b in FIG. 4a. The spacer 200 is removed in any number of ways, such as by etching, for example. According to some embodiments, after the spacer 200 is removed, the second portion 116 of the first type region 104 is exposed. According to some embodiments, the first insulator layer 300 surrounds at least some of the second portion 116 of the first type region 104 or at least some of the channel region 130. In some embodiments, after removal of the spacer 200, an opening 400 is formed between the first insulator layer 300 and at least one of the second portion 116 of the first type region 104 or the channel region 130. According to some embodiments, an uncovered portion 415 of the first portion 112 of the first type region 104 exists or is exposed after removal of the spacer 200.

Turning to FIG. 4b, according to some embodiments, the channel region 130 is separated a first distance 410 from the first portion 112 of the first type region 104. According to some embodiments, the first distance 410 is between about 0 nm to about 1 nm. In an embodiment, the first distance 410 is about 0 nm when the second portion 116 of the first type region 104 is not formed.

Figure 5:
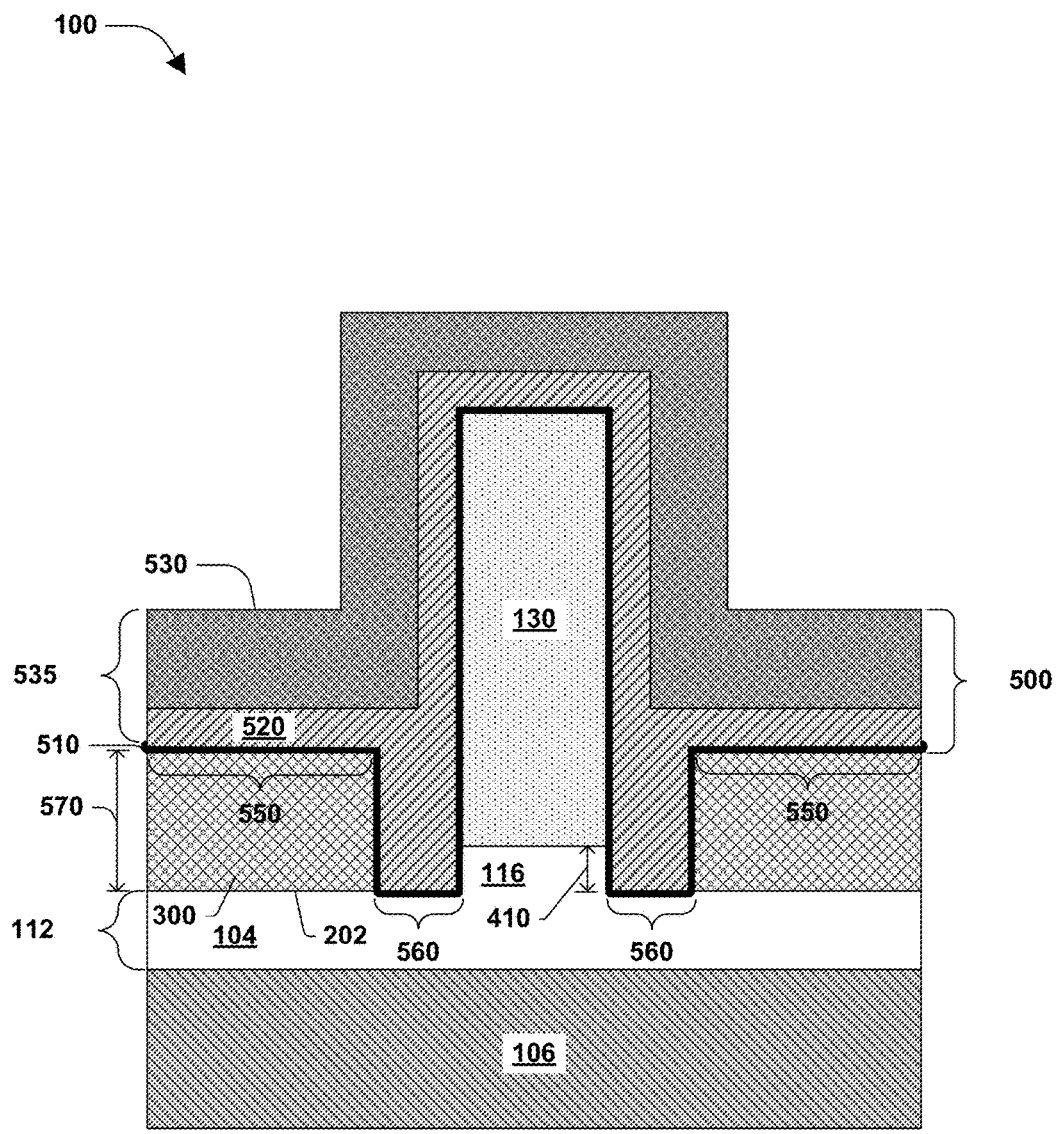
FIG. 5 illustrates forming a gate region associated with forming a semiconductor device, according to an embodiment.

Turning now to FIG. 5, in some embodiments, a gate region 500 is formed surrounding the channel region 130. In an embodiment, the gate region 500 comprises a dielectric region 510. In some embodiments, the dielectric region 510 is formed over the first insulator layer 300, first portion 112 and second portion 116 of the first type region 104, and the channel region 130. In an embodiment, the dielectric region 510 comprises a dielectric material with a relatively high dielectric constant. In some embodiments, the dielectric region 510 comprises a standard dielectric material with a medium or low dielectric constant, such as $SiO_2$. The dielectric region 510 is formed in any number of ways, such as by thermal growth, chemical growth, atomic layer deposition (ALD), chemical vapor deposition (CVD), plasma-enhanced chemical vapor deposition (PECVD), etc.

In some embodiments, a work function region 520 is formed over the dielectric region 510. In an embodiment, the work function region 520 comprises a p-type work function metal. In an embodiment, the work function region 520 comprises a midgap work function metal. In some embodiments, the work function region 520 is formed by atomic layer deposition (ALD), chemical vapor deposition (CVD), plasma-enhanced chemical vapor deposition (PECVD), sputtering, etc., or other suitable processes.

In some embodiments, a metal layer 530 is formed over the work function region 520. In an embodiment, the work function region 520 and metal layer 530 together comprise a gate electrode 535. In some embodiments, the metal layer 530 is formed at least partially surrounding the channel region 130. The metal layer 530 is formed in any number of ways, such as by atomic layer deposition (ALD), sputtering, thermal evaporation, e-beam evaporation, chemical vapor deposition (CVD), etc., for example. In some embodiments, metal layer 530 includes a conductive material, such as TiN, TaN, TaC, TaCN, tungsten, aluminum, copper, polysilicon, etc., alone or in combination.

In some embodiments, the gate region 500 comprises a first portion 550 and a second portion 560. In some embodiments, the second portion 560 of the gate region 500 is located in closer proximity to the channel region 130 than the first portion 550 of the gate region 500. According to some embodiments, the first portion 550 of the gate region 500 is separated a second distance 570 from the first portion 112 of the first type region 104. In some embodiments, the second distance 570 is measured from the dielectric region 510 at the first portion 550 of the gate region 500 to the top surface 202 at the first portion 112 of the first type region 104. According to some embodiments, the second distance 570 is greater than the first distance 410.

Figure 6:
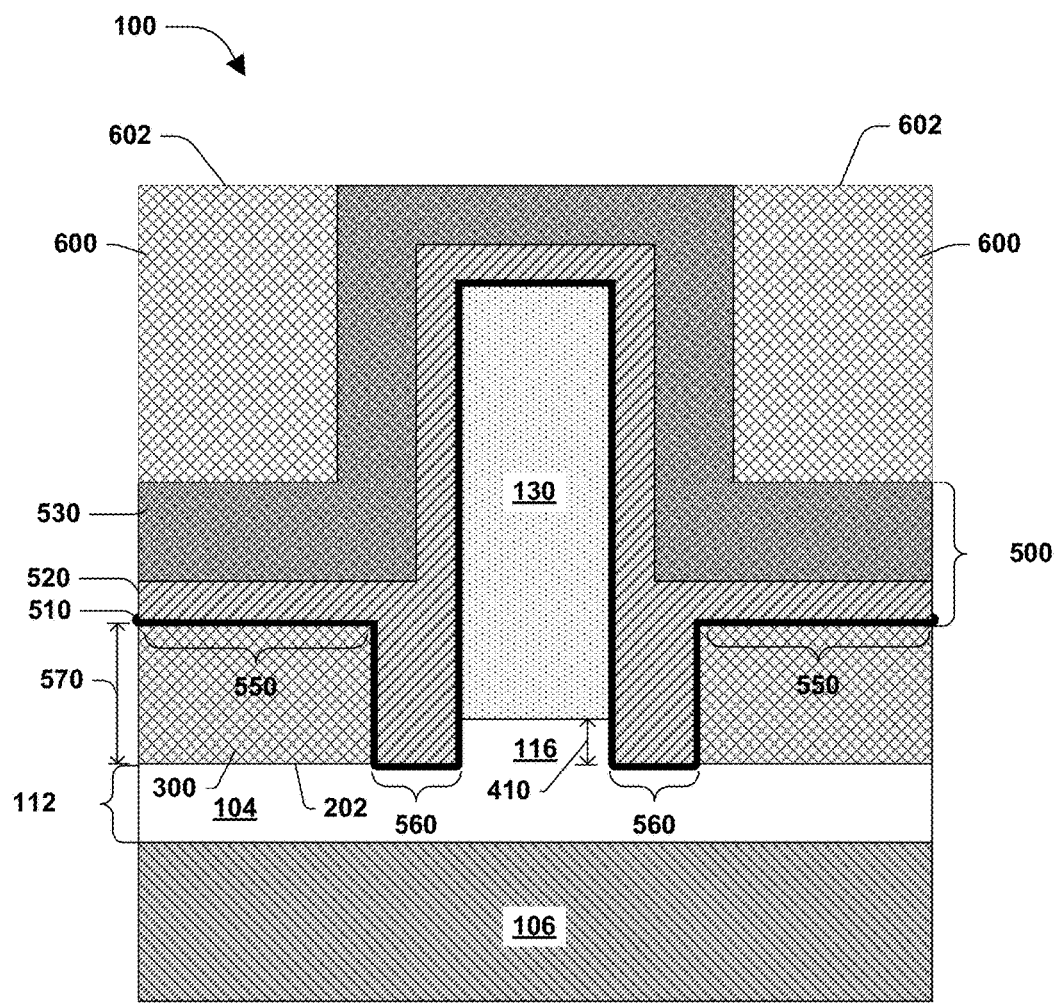
FIG. 6 illustrates a portion of a semiconductor device, according to an embodiment.

Turning now to FIG. 6, an insulator layer 600 is formed over the metal layer 530 of the gate region 500. The insulator layer 600 is formed in any number of ways, such as by deposition, chemical vapor deposition (CVD), or other suitable methods, for example. The insulator layer 600 includes any number of materials, including oxides, silicon oxide, nitrides, silicon nitride, oxynitrides, $SiO_2$, etc., alone or in combination. In some embodiments, a top surface 602 of the insulator layer 600 is planarized, such as by a chemical mechanical polishing (CMP) process.

Figure 7:
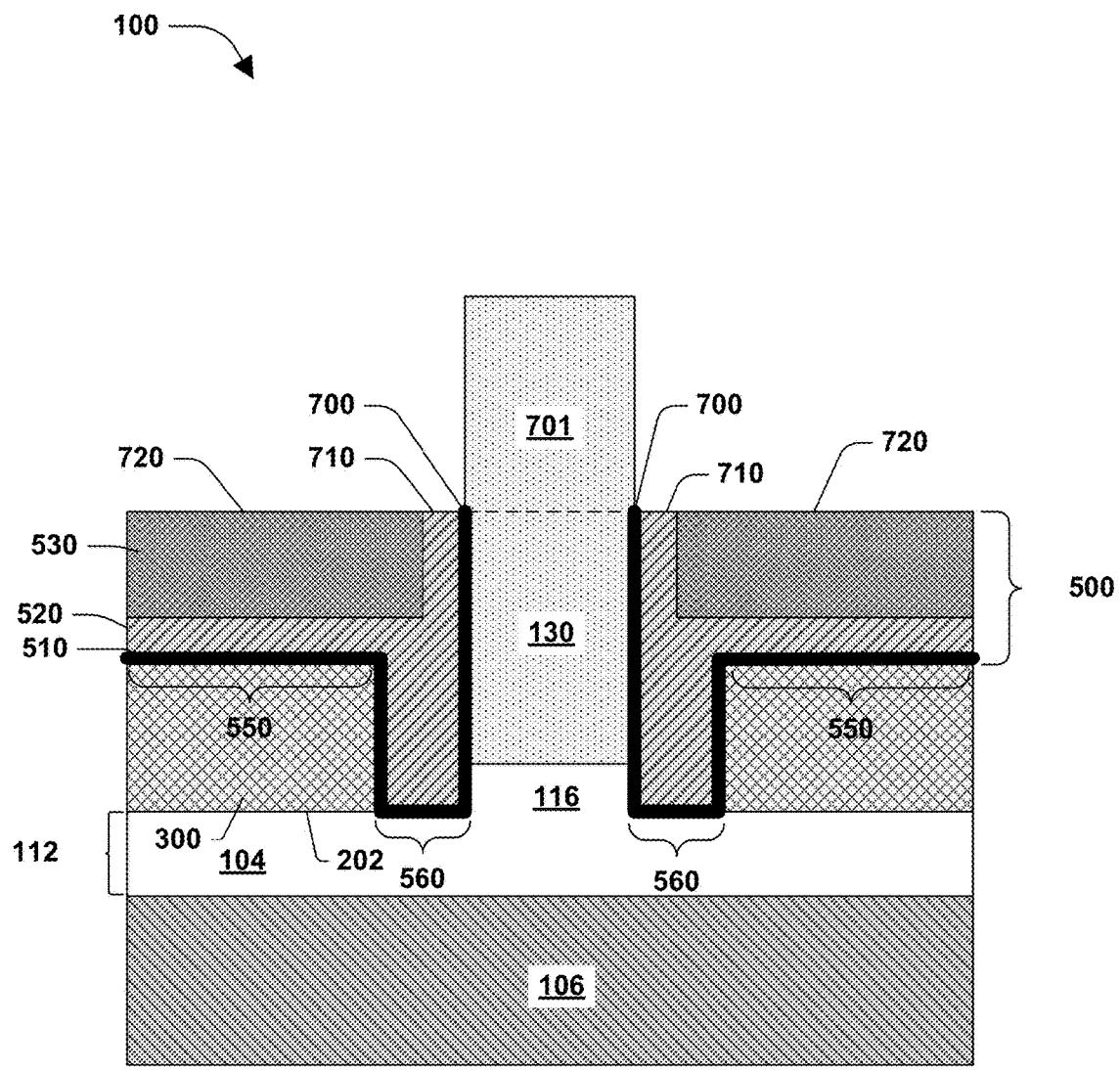
FIG. 7 illustrates a portion of a semiconductor device, according to an embodiment.

Turning now to FIG. 7, in an embodiment, portions of the dielectric region 510, work function region 520, metal layer 530, and insulator layer 600 are removed, such as by etching. According to some embodiments, a top surface 700 of the dielectric region 510, a top surface 710 of the work function region 520, and a top surface 720 of the metal layer 530 are substantially planar. In some embodiments, after portions of the dielectric region 510, work function region 520, and metal layer 530 are removed, the channel region 130 is substantially surrounded by the dielectric region 510, work function region 520, and metal layer 530. In some embodiments, a drift region 701 exists above the channel region 130 and the top surface 700, 710, 720 of the gate region 500.

Figure 8:
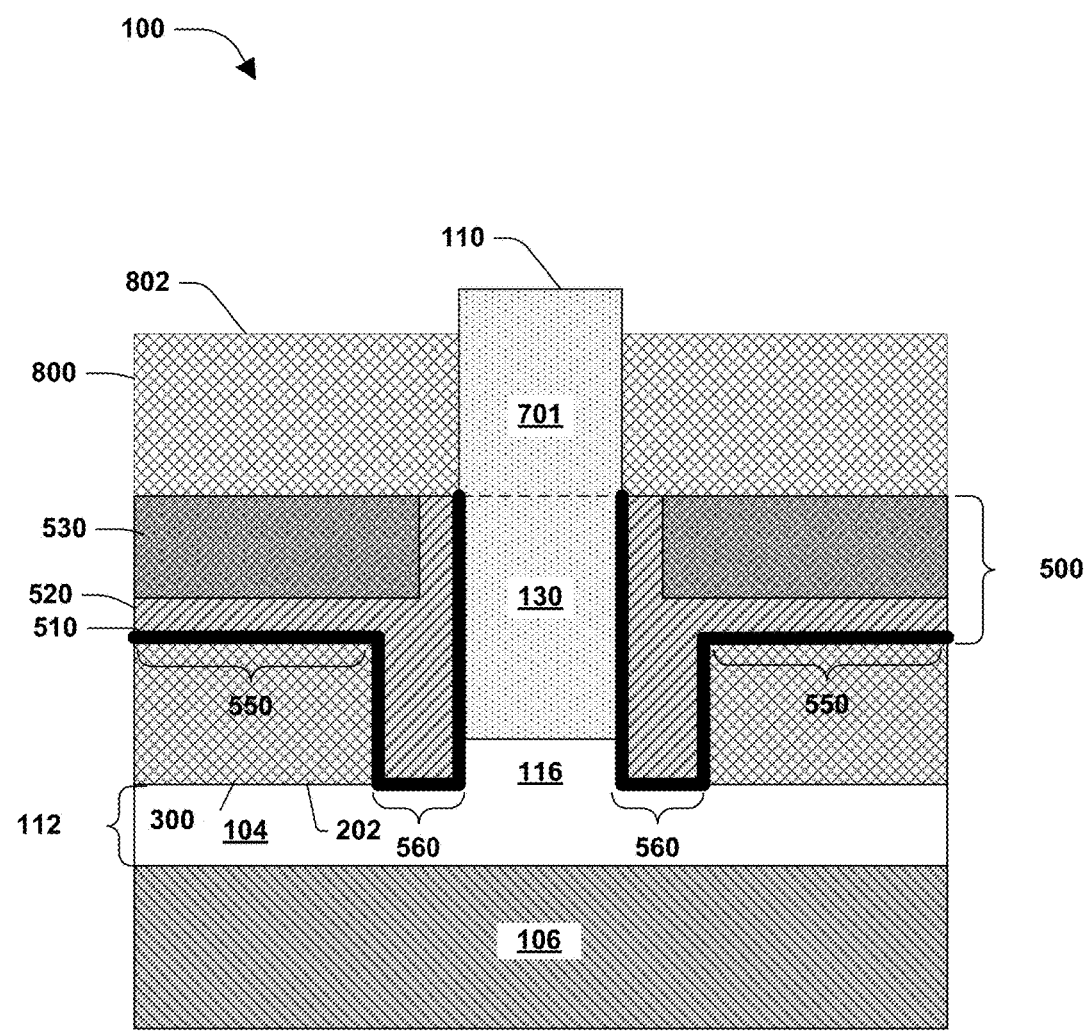
FIG. 8 illustrates a portion of a semiconductor device, according to an embodiment.

Turning now to FIG. 8, according to some embodiments, a second insulator layer 800 is formed over the gate region 500 and around the nanowire 110. The second insulator layer 800 is formed in any number of ways, such as by deposition, chemical vapor deposition (CVD), or other suitable methods, for example. The second insulator layer 800 includes any number of materials, including oxides, silicon oxide, nitrides, silicon nitride, oxynitrides, $SiO_2$, etc., alone or in combination. In some embodiments, a top surface 802 of the second insulator layer 800 is substantially planar.

Figure 9:
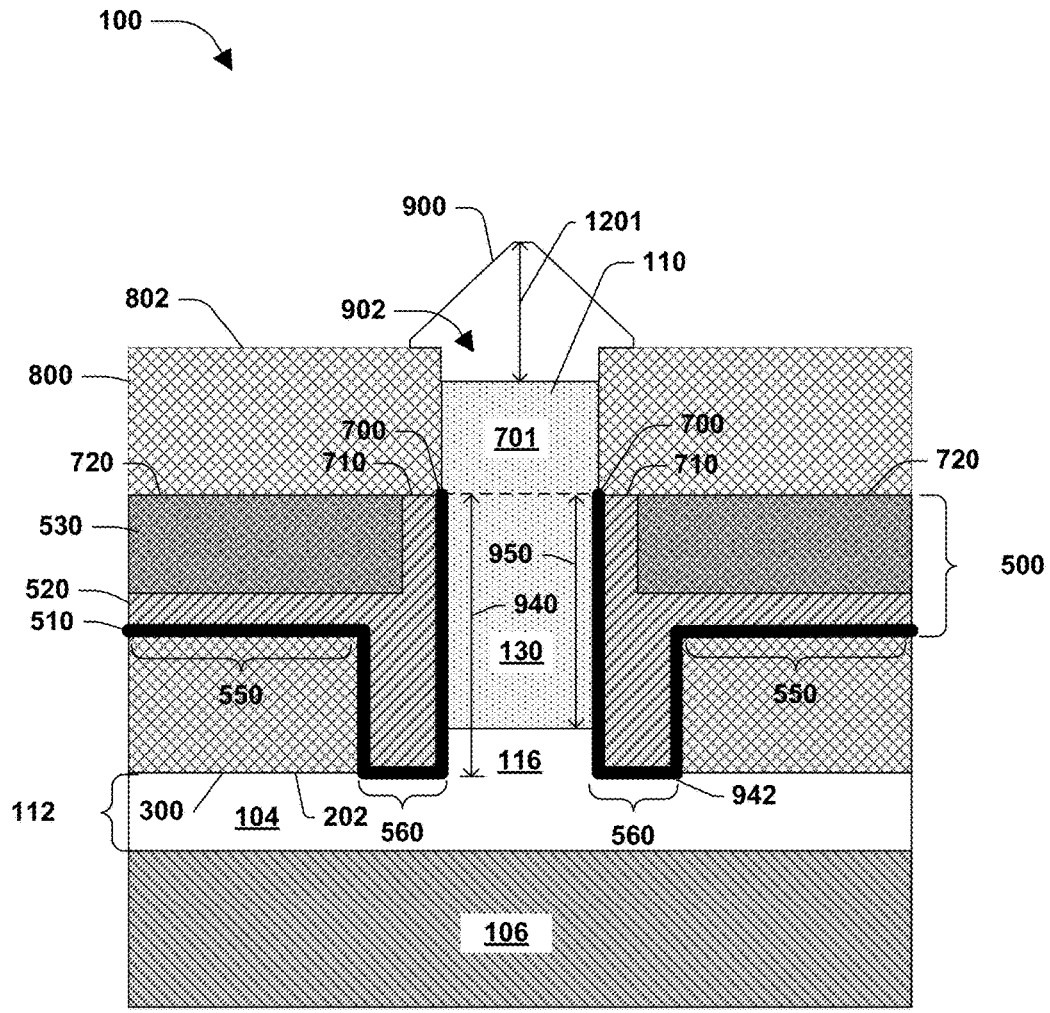
FIG. 9 illustrates forming a second type region associated with forming a semiconductor device, according to an embodiment.

Turning now to FIG. 9, a second type region 900 is formed, such as by doping a second end 902 of the nanowire 110. In some embodiments, the second type region 900 is formed by an epitaxial growth process (as illustrated). In some embodiments, the channel region 130 extends between a top surface of the second portion 116 of the first type region 104 and the drift region 701, with the drift region 701 extending between the channel region 130 and the second type region 900. According to some embodiments, the second type region 900 comprises a second conductivity type. In some embodiments, the second conductivity type of the second type region 900 comprises a p-type material, p+ type material, p++ type material, p-type dopants such as Boron, Gallium, Indium, etc., alone or in combination. In some embodiments, the second conductivity type of the second type region 900 comprises an n-type material, n+ type material, n++ type material, n-type dopants such as Phosphorous, Arsenic, Antimony, etc., alone or in combination. According to some embodiments, the second type region 900 comprises a source region. According to some embodiments, the second type region 900 comprises a drain region.

According to some embodiments, the first conductivity type of the first type region 104 is the same or substantially similar to the second conductivity type of the second type region 900. In some embodiments, the first conductivity type of the first type region 104 and the second conductivity type of the second type region 900 comprises a p-type material, p+ type material, p++ type material, p-type dopants such as Boron, Gallium, Indium, etc., alone or in combination. In some embodiments, the first conductivity type of the first type region 104 and the second conductivity type of the second type region 900 comprises an n-type material, n+ type material, n++ type material, n-type dopants such as Phosphorous, Arsenic, Antimony, etc., alone or in combination. In some embodiments, the third conductivity type of the channel region 130 is the same or substantially similar to the first conductivity type of the first type region 104 and the second conductivity type of the second type region 900. In some embodiments, the third conductivity type of the channel region 130 is different from the first conductivity type of the first type region 104 and the second conductivity type of the second type region 900.

In some embodiments, the gate region 500 comprises a gate region length 940 measured from a bottom surface 942 of the dielectric region 510 at the second portion 560 of the gate region 500 to the top surface 700, 710, 720 of the gate region 500. In an embodiment, the channel region 130 comprises a channel region length 950 measured from the top surface of the second portion 116 of the first type region 104 to the top surface 700, 710, 720 of the gate region 500. In an embodiment, the channel region length 950 of the channel region 130 is less than the gate region length 940 of the gate region 500.

Figure 10:
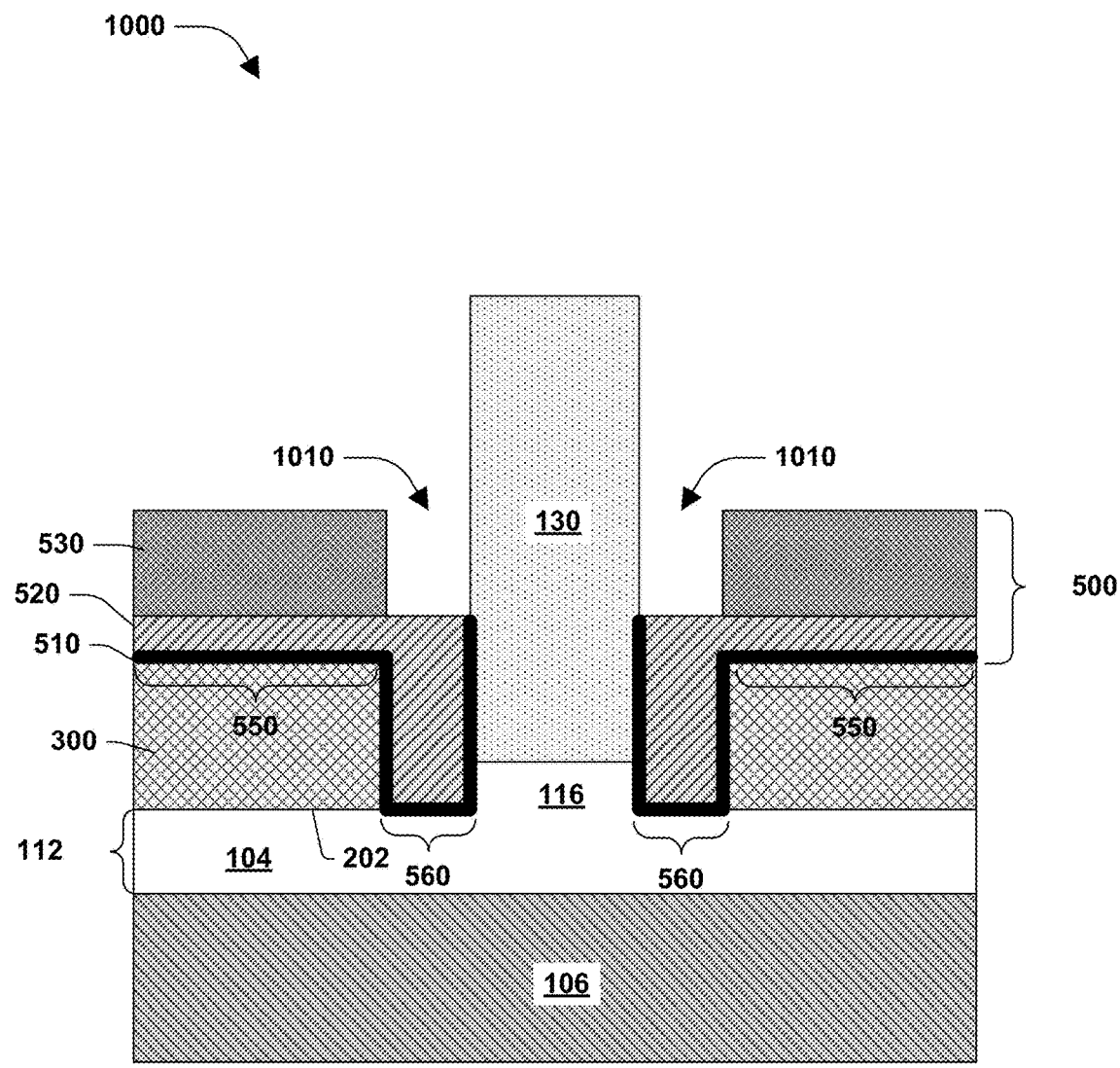
FIG. 10 illustrates a portion of a semiconductor device, according to an embodiment.

FIG. 10 illustrates an embodiment of a second semiconductor device 1000 after the formation of the gate region 500 following the embodiment illustrated in FIGS. 5 and 6. According to some embodiments, the second semiconductor device 1000 comprises the first type region 104, substrate region 106, channel region 130, first insulator layer 300, gate region 500, dielectric region 510, work function region 520, metal layer 530, etc.

In some embodiments, portions of the dielectric region 510, work function region 520, metal layer 530, and insulator layer 600 (illustrated in FIG. 6) are removed, such as by etching. According to some embodiments, a first opening 1010 is formed by removing upper portions of the dielectric region 510, work function region 520, and metal layer 530 within the second portion 560 of the gate region 500. In some embodiments, the first opening 1010 is located between the channel region 130 and the metal layer 530.

Figure 11:
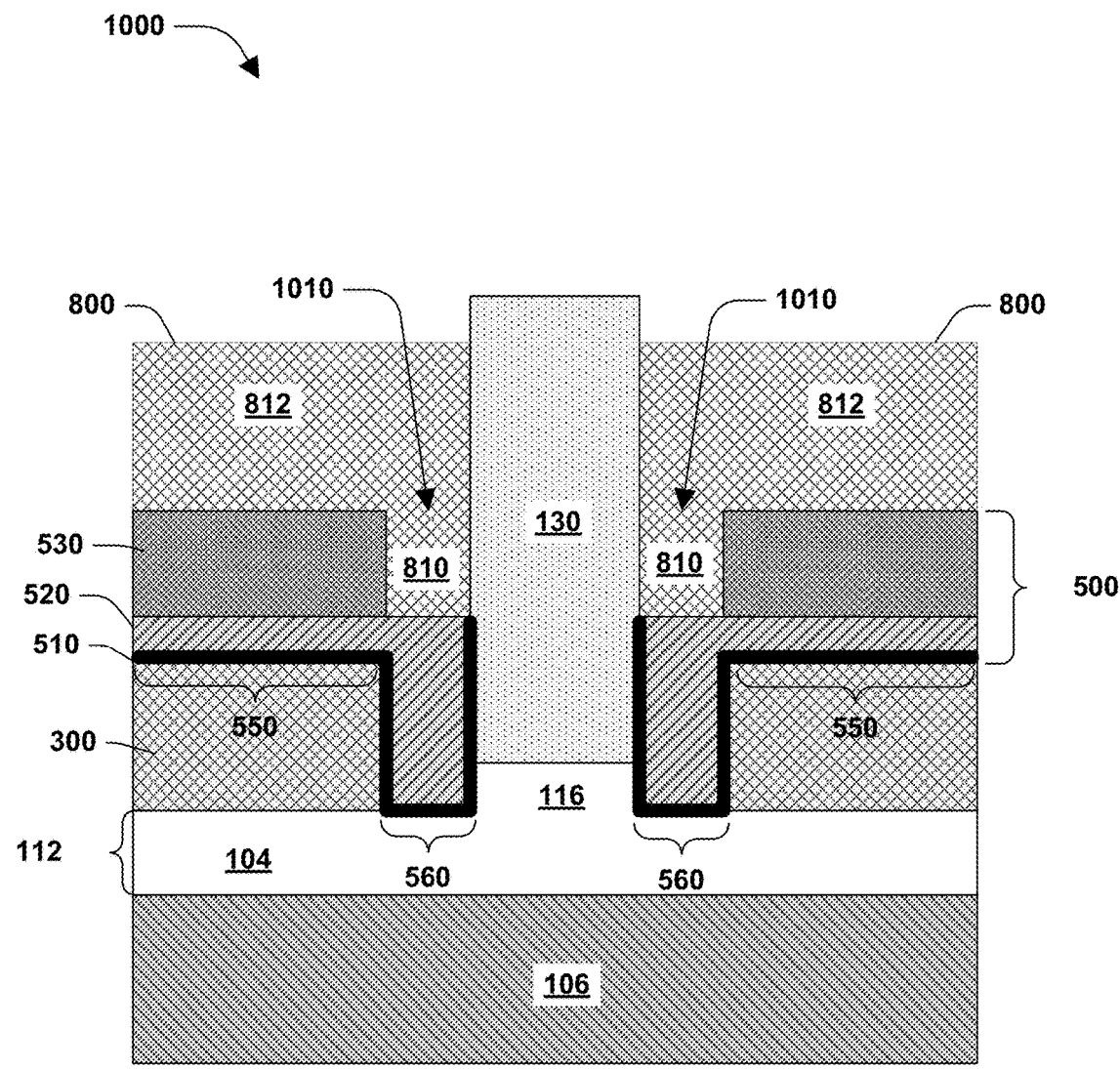
FIG. 11 illustrates a portion of a semiconductor device, according to an embodiment.

Turning now to FIG. 11, according to some embodiments, the second insulator layer 800 is formed over the gate region 500 and around the channel region 130. The second insulator layer 800 is formed in any number of ways, such as by deposition, chemical vapor deposition (CVD), or other suitable methods, for example. In an embodiment, the second insulator layer 800 comprises a first portion 810 and a second portion 812. In some embodiments, the first portion 810 of the second insulator layer 800 is formed within the first opening 1010. In some embodiments, the first portion 810 of the second insulator layer 800 surrounds the channel region 130 and extends between the channel region 130 and the metal layer 530 of the gate region 500. In some embodiments, the second portion 812 of the second insulator layer 800 is formed over the metal layer 530 and first portion 810 of the second insulator layer 800. In some embodiments, the first portion 810 of the second insulator layer 800 surrounds an upper portion of the channel region 130, and not the entire channel region 130. In an embodiment, the second portion 812 of the second insulator layer 800 surrounds the channel region 130, such as an upper portion of the channel region 130.

Figure 12:
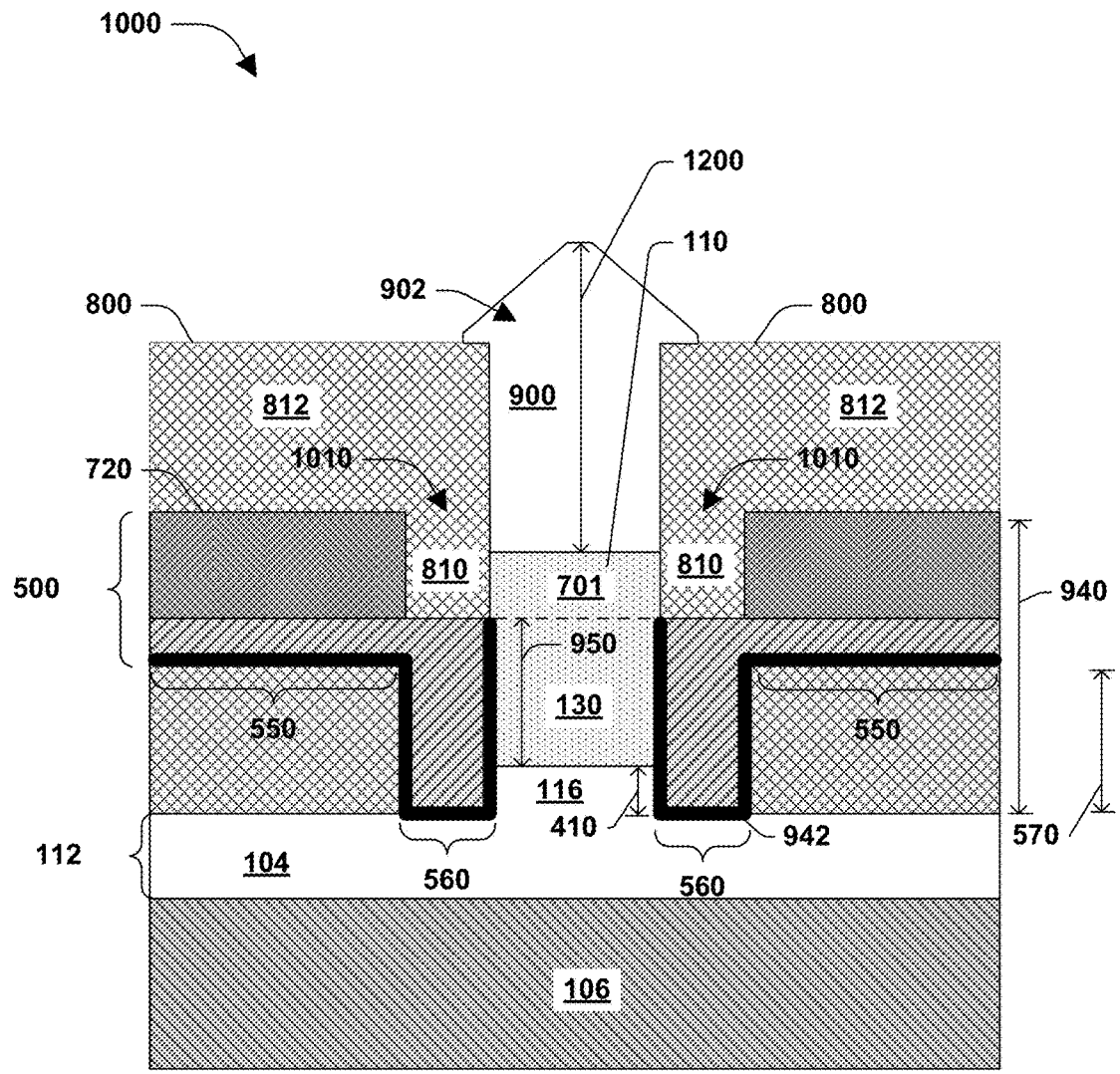
FIG. 12 illustrates forming a second type region associated with forming a semiconductor device, according to an embodiment.

Turning now to FIG. 12, according to some embodiments, the second type region 900 is formed, such as by doping the second end 902 of the nanowire 110. According to some embodiments, the second type region 900 is formed such that a second type region length 1200 of the second type region 900 is greater than a second type region length 1201 of the second type region 900 in the embodiment of FIG. 9. In some embodiments, the gate region length 940 of the gate region 500 is greater than the channel region length 950 of the channel region 130. Accordingly, in some embodiments, the channel region length 950 of the channel region 130 is less than the channel region length 950 in the embodiment of FIG. 9. According to some embodiments, at least some of the second type region 900 and the second end 902 of the nanowire 110 are formed by epitaxial growth. According to some embodiments, epitaxial growth includes solid-phase epitaxy.

Figure 13A:
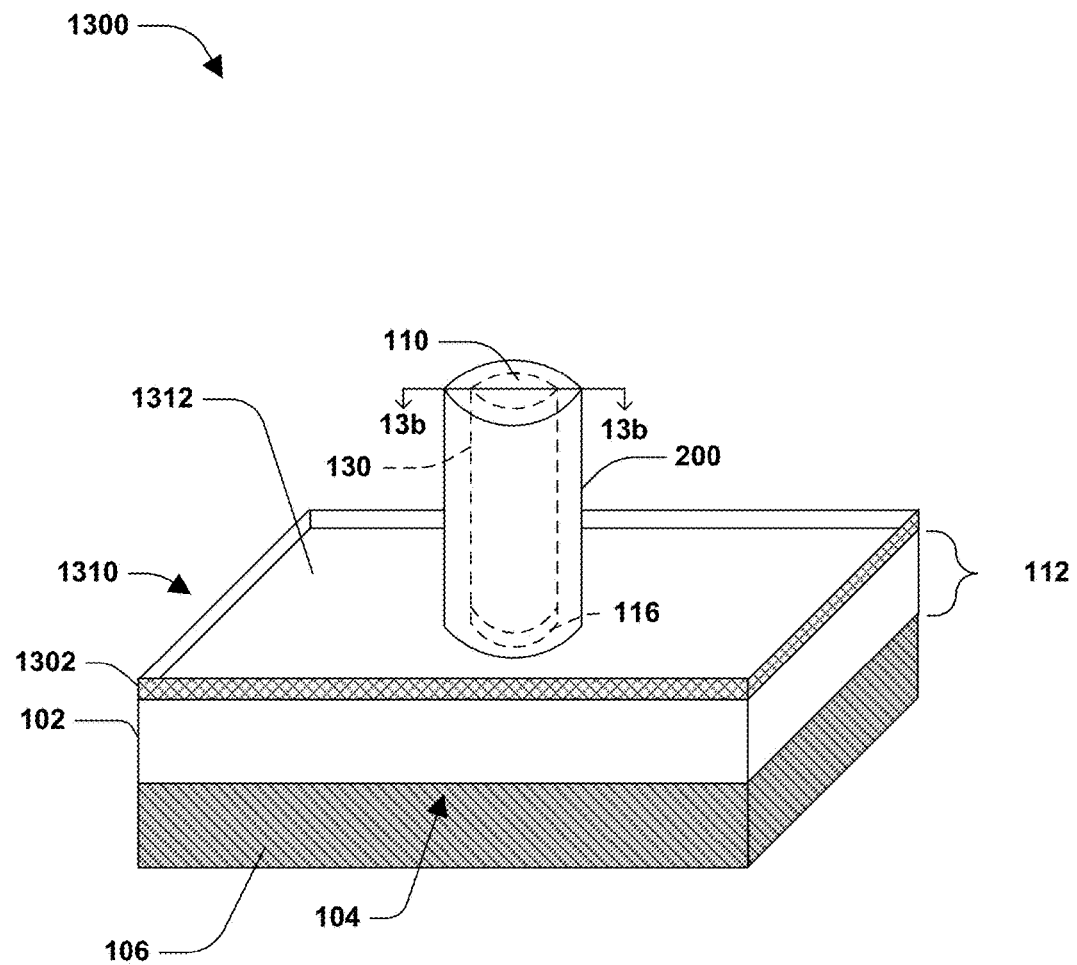
FIG. 13a illustrates a portion of a portion of a semiconductor device, according to an embodiment.
Figure 13B:
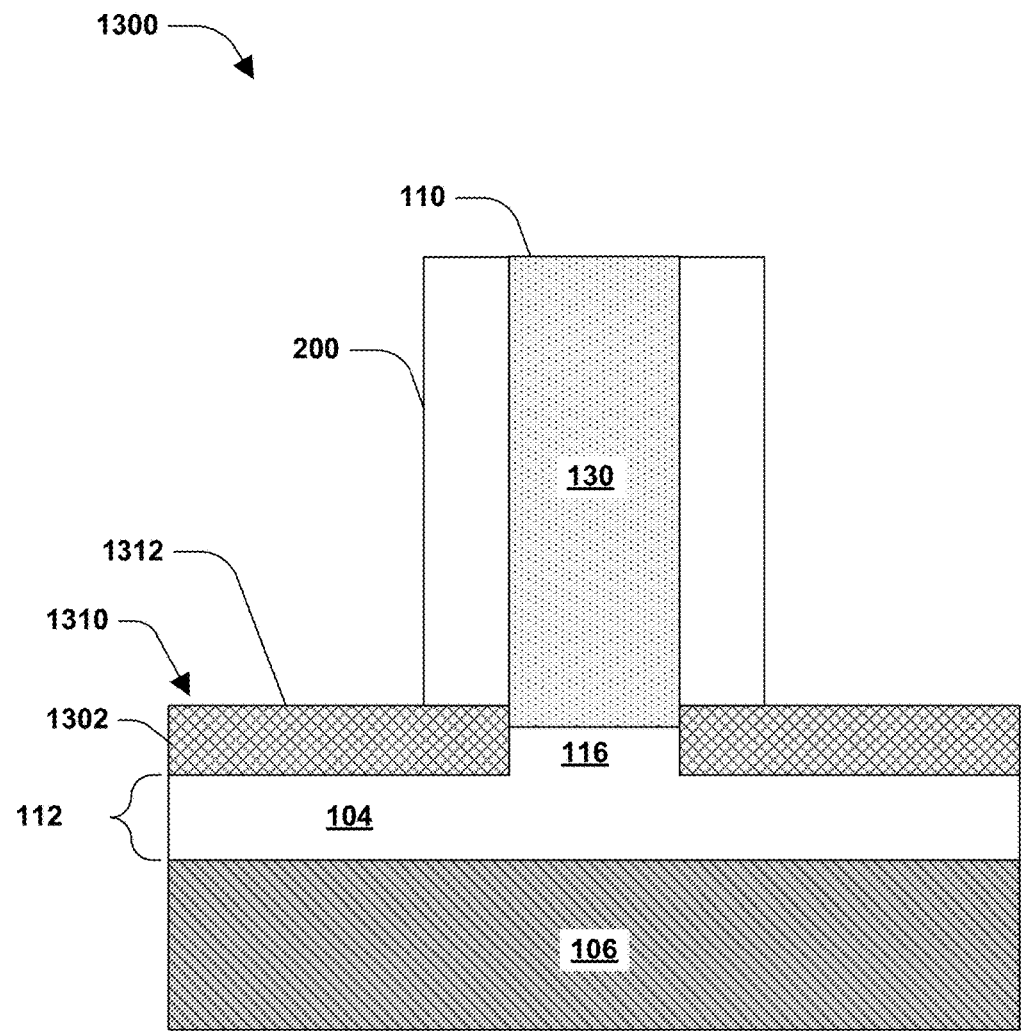
FIG. 13b illustrates a portion of a portion of a semiconductor device, according to an embodiment.

FIGS. 13a and 13b illustrate an embodiment of a third semiconductor device 1300. FIG. 13b is a cross-sectional view of the embodiment of FIG. 13a taken along lines 13b-13b in FIG. 13a. According to some embodiments, the third semiconductor device 1300 comprises the doped region 102, first type region 104, substrate region 106, nanowire 110, channel region 130, etc.

In some embodiments, a first portion 1302 of a first insulator layer 1310 is formed over the first portion 112 of the first type region 104. The first portion 1302 of the first insulator layer 1310 is formed in any number of ways, such as by deposition, chemical vapor deposition (CVD), or other suitable methods, for example. The first portion 1302 of the first insulator layer 1310 includes any number of materials, including oxides, silicon oxide, nitrides, silicon nitride, oxynitrides, $SiO_2$, etc., alone or in combination. In some embodiments, a top surface 1312 of the first portion 1302 of the first insulator layer 1310 is substantially planar. In some embodiments, the spacer 200 is formed over the first portion 1302 of the first insulator layer 1310.

Figure 14:
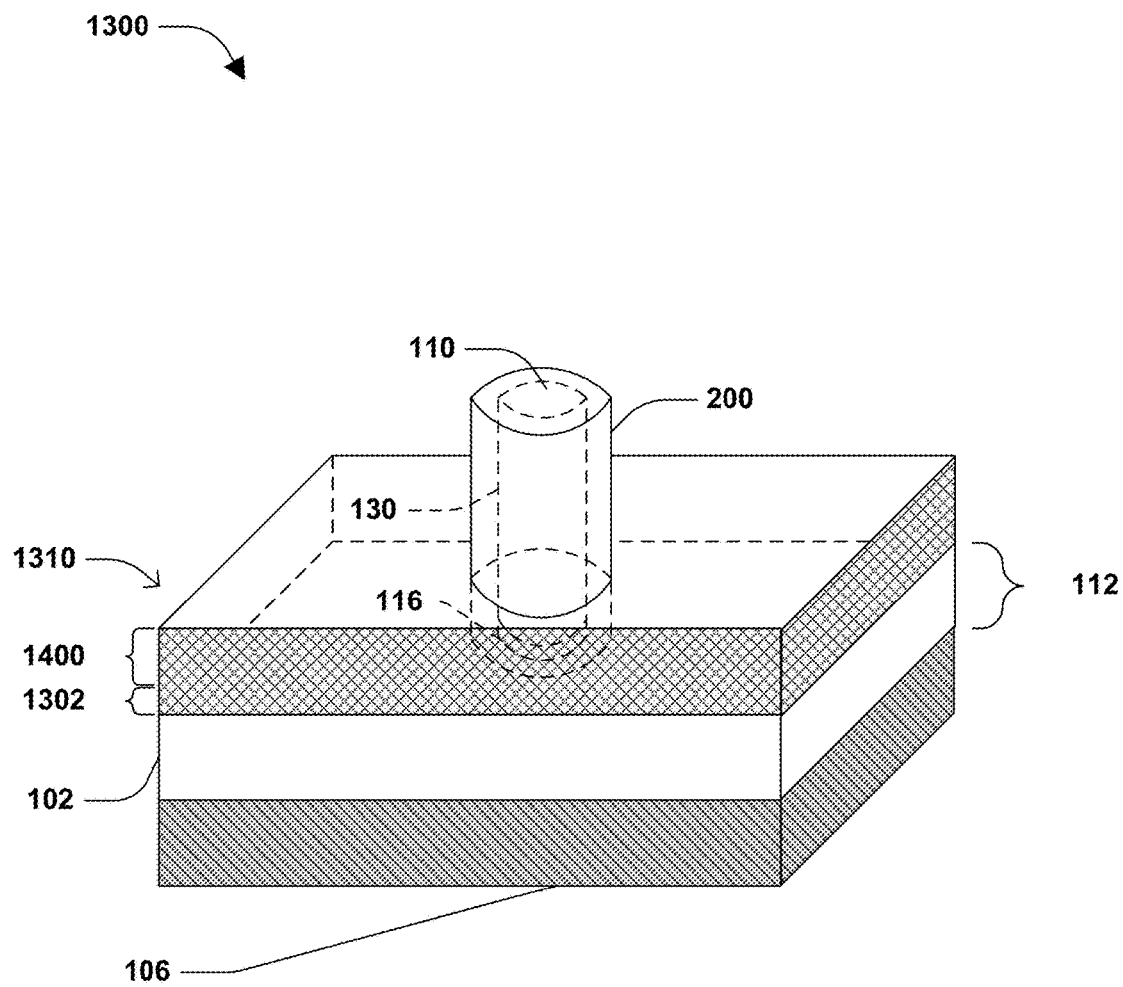
FIG. 14 illustrates a portion of a semiconductor device, according to an embodiment.

Turning now to FIG. 14, in some embodiments, a second portion 1400 of the first insulator layer 1310 is formed over the first portion 1302 of the first insulator layer 1310 and around the spacer 200. The second portion 1400 of the first insulator layer 1310 is formed in any number of ways, such as by deposition, chemical vapor deposition (CVD), or other suitable methods, for example. The second portion 1400 of the first insulator layer 1310 includes any number of materials, including oxides, silicon oxide, nitrides, silicon nitride, oxynitrides, $SiO_2$, etc., alone or in combination.

Figure 15A:
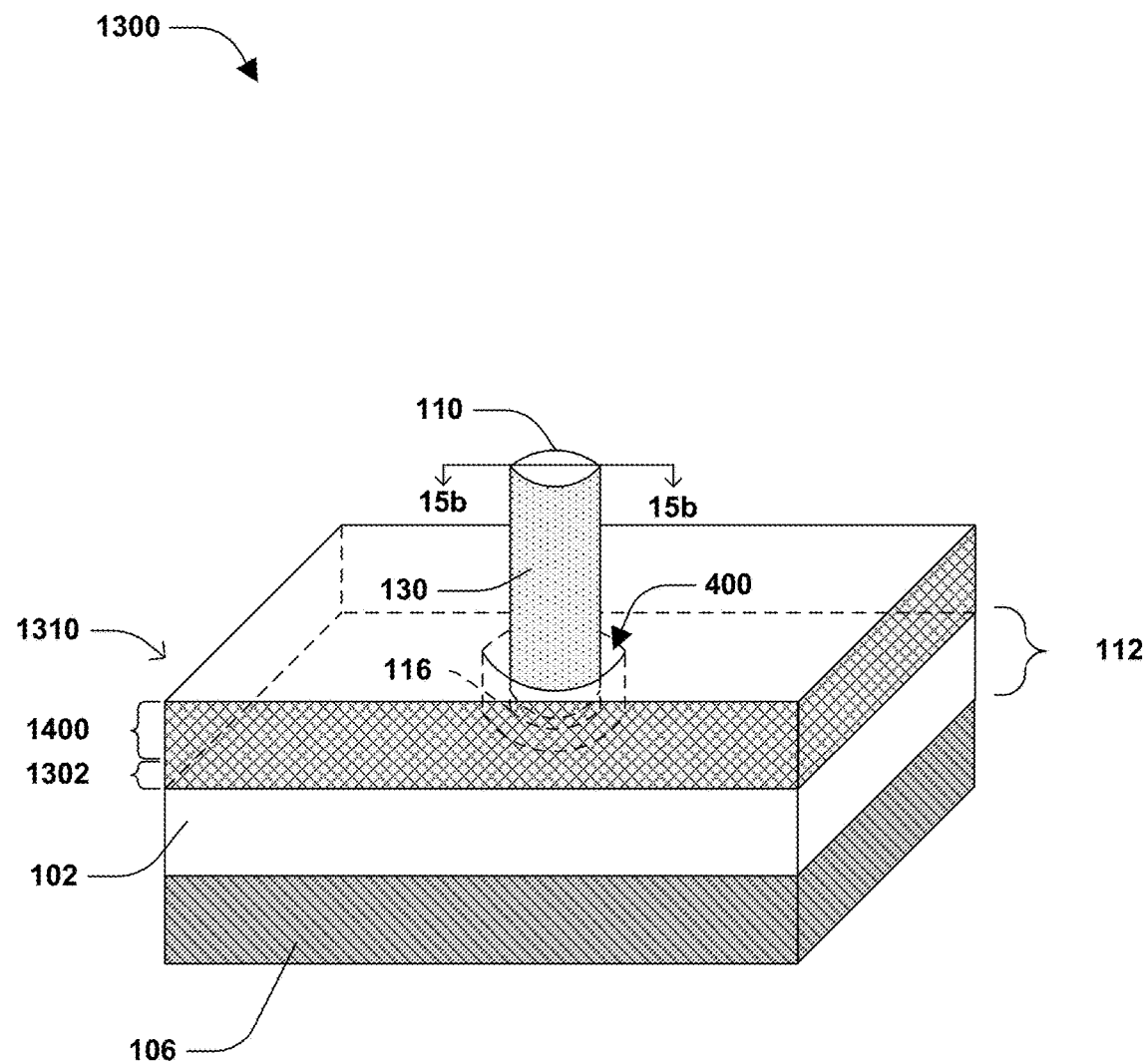
FIG. 15a illustrates a portion of a semiconductor device, according to an embodiment.
Figure 15B:
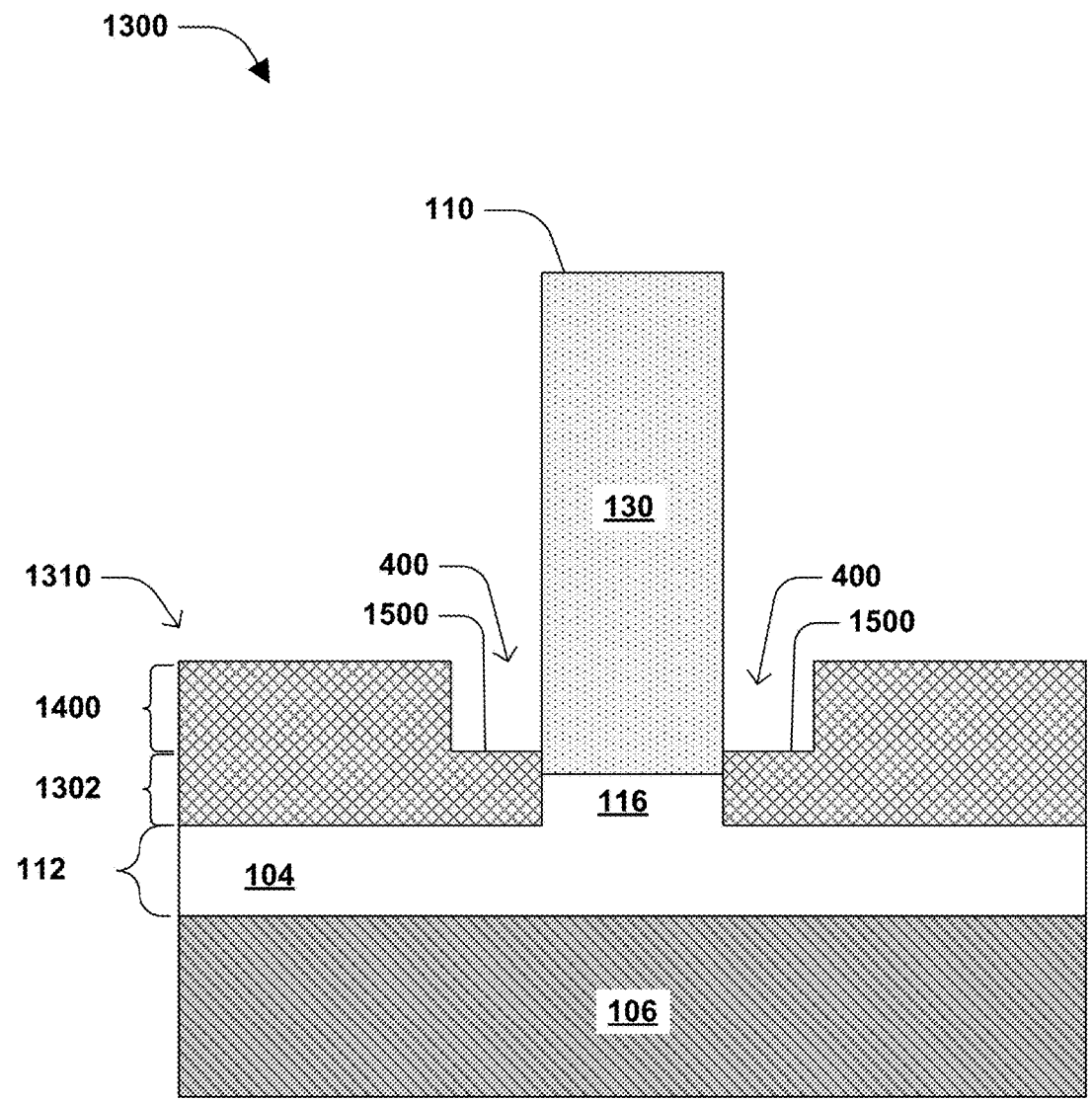
FIG. 15b illustrates a portion of a semiconductor device, according to an embodiment.

Turning now to FIG. 15a, in an embodiment, the spacer 200 is removed. FIG. 15b is a cross-sectional view of the embodiment of FIG. 15a taken along lines 15b-15b in FIG. 15a. The spacer 200 is removed in any number of ways, such as by etching, for example. According to some embodiments, after the spacer 200 is removed, an uncovered portion 1500 (illustrated in FIG. 15b) of the first portion 1302 of the first insulator layer 1310 is exposed. According to some embodiments, the first portion 1302 of the first insulator layer 1310 surrounds at least some of the second portion 116 of the first type region 104 or at least some of a second drift region 1901 (illustrated in FIG. 19) below the channel region 130. In some embodiments, after removal of the spacer 200, the opening 400 is formed between the second portion 1400 of the first insulator layer 300 and at least one of the second portion 116 of the first type region 104 or the channel region 130.

Figure 16:
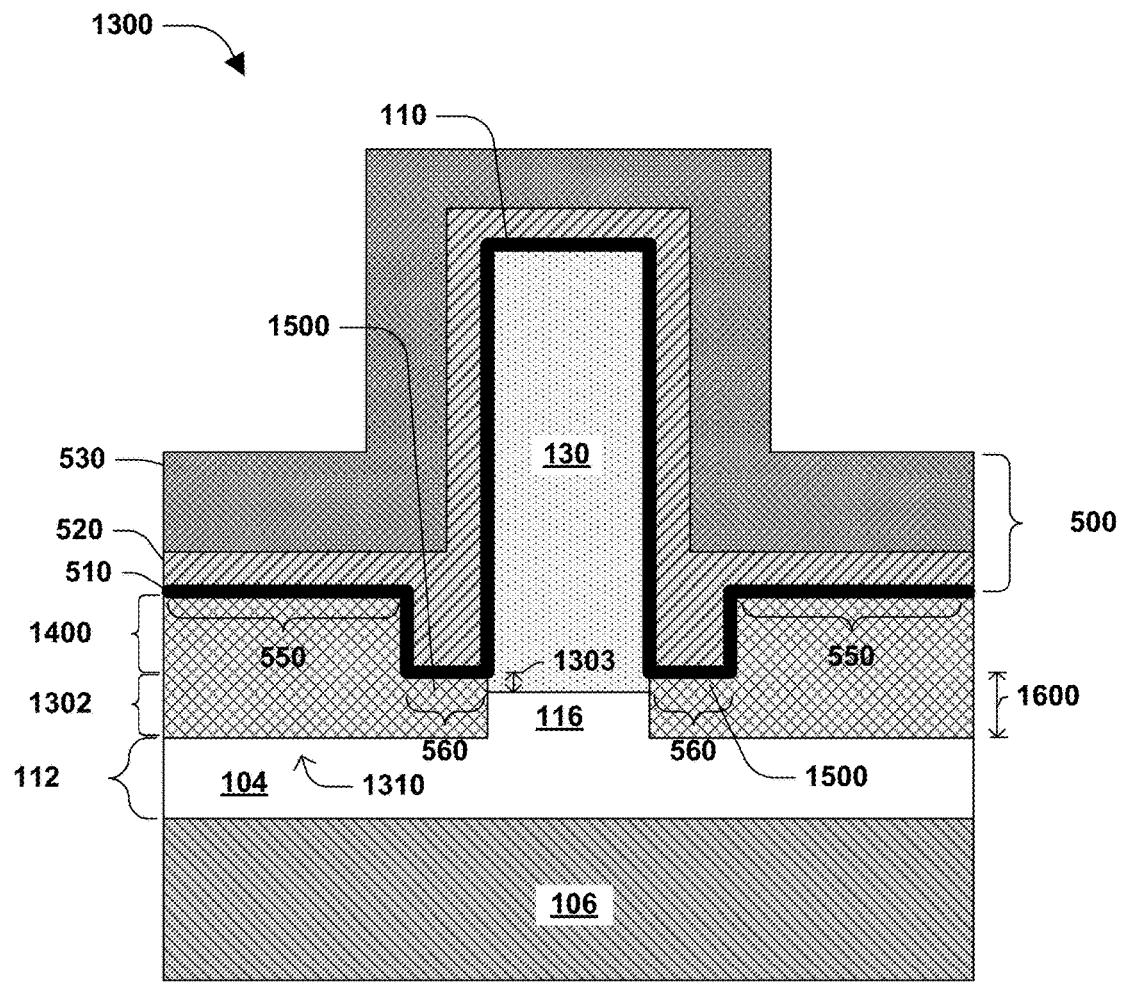
FIG. 16 illustrates forming a gate region associated with forming a semiconductor device, according to an embodiment.

Turning now to FIG. 16, in some embodiments, the gate region 500 is formed surrounding the channel region 130. According to some embodiments, the gate region 500 is formed over the uncovered portion 1500 of the first portion 1302 of the first insulator layer 1310 and over the second portion 1400 of the first insulator layer 1310. In some embodiments, the gate region 500 comprises the dielectric region 510, work function region 520, and metal layer 530. According to some embodiments, after formation of the gate region 500, the first portion 1302 of the first insulator layer 1310 surrounds at least some of the second drift region 1901 (illustrated in FIG. 19) below the channel region 130 and extends between the first portion 112 of the first type region 104 and the second portion 560 of the gate region 500. In an embodiment, the first portion 1302 of the first insulator layer 1310 surrounding the second drift region 1901 has a thickness 1303 of about one tenth or less of the channel region length 950 (illustrated in FIGS. 20 and 21) of the channel region 130. In some embodiments, the first portion 1302 of the first insulator layer 1310 surrounds the second drift region 1901, but does not surround or envelope the channel region 130. In an embodiment, the second portion 560 of the gate region 500 is separated a third distance 1600 from the first portion 112 of the first type region 104. In an embodiment, a thickness of the first portion 1302 of the first insulator layer 1310 generally corresponds to the third distance 1600.

Figure 17:
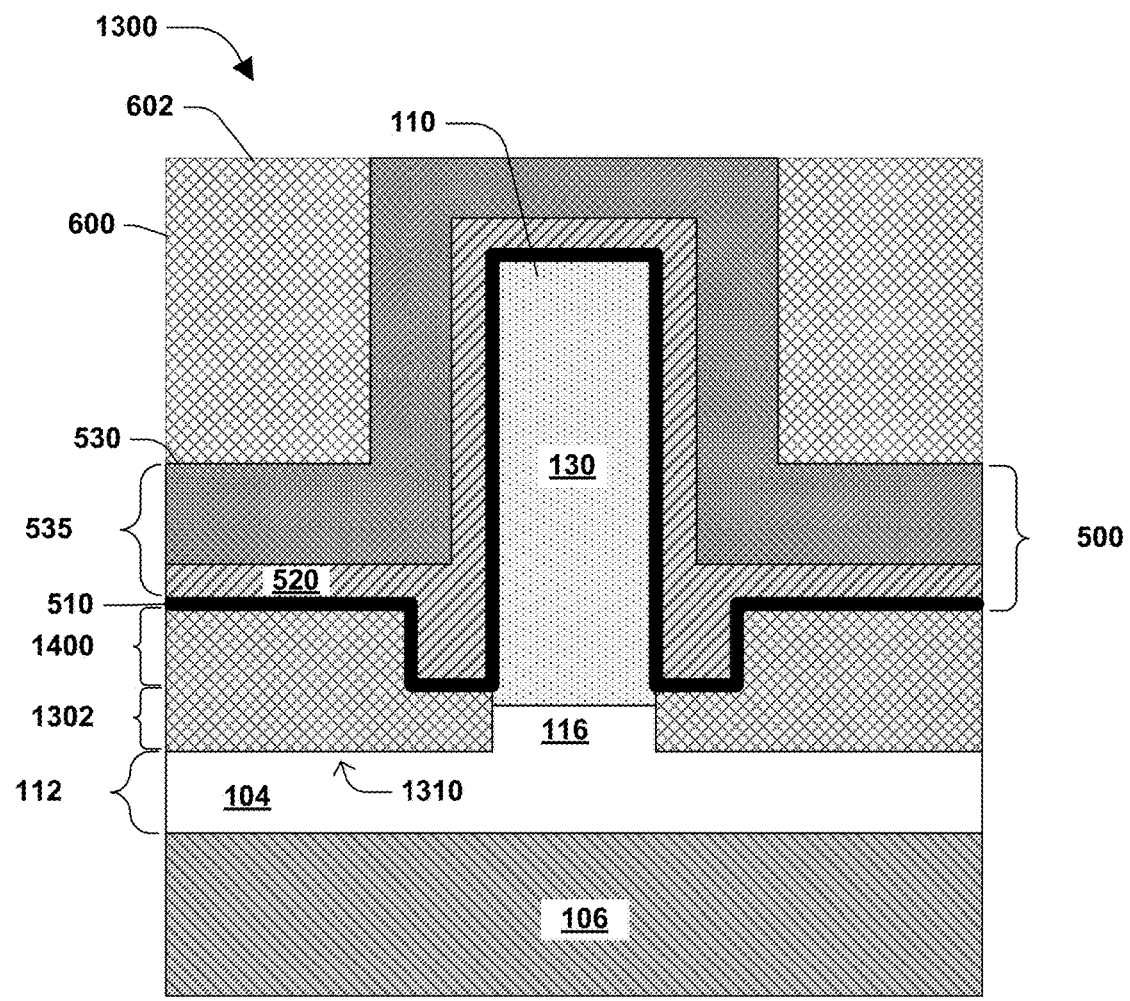
FIG. 17 illustrates a portion of a semiconductor device, according to an embodiment.
Figure 18:
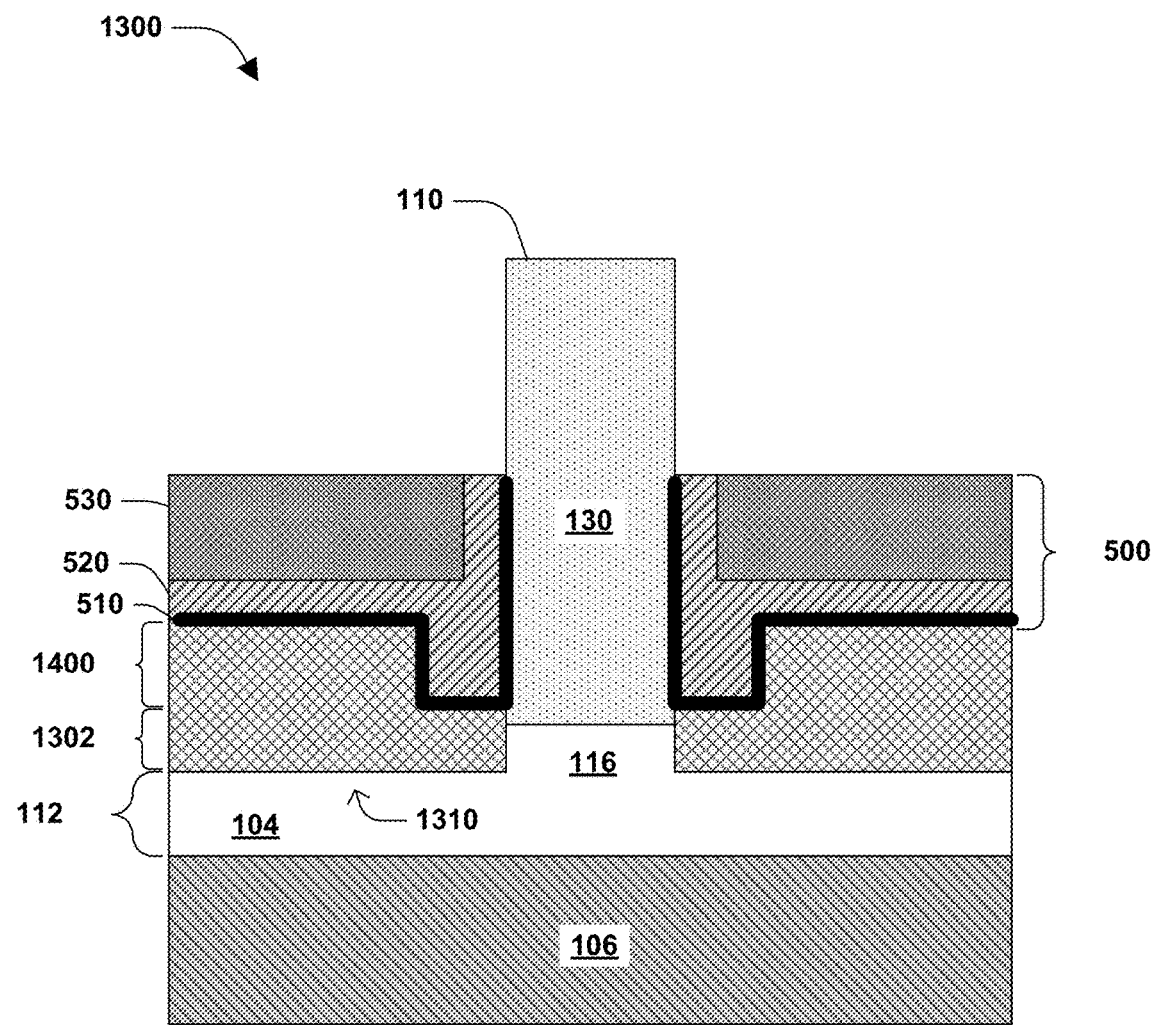
FIG. 18 illustrates a portion of a semiconductor device, according to an embodiment.
Figure 19:
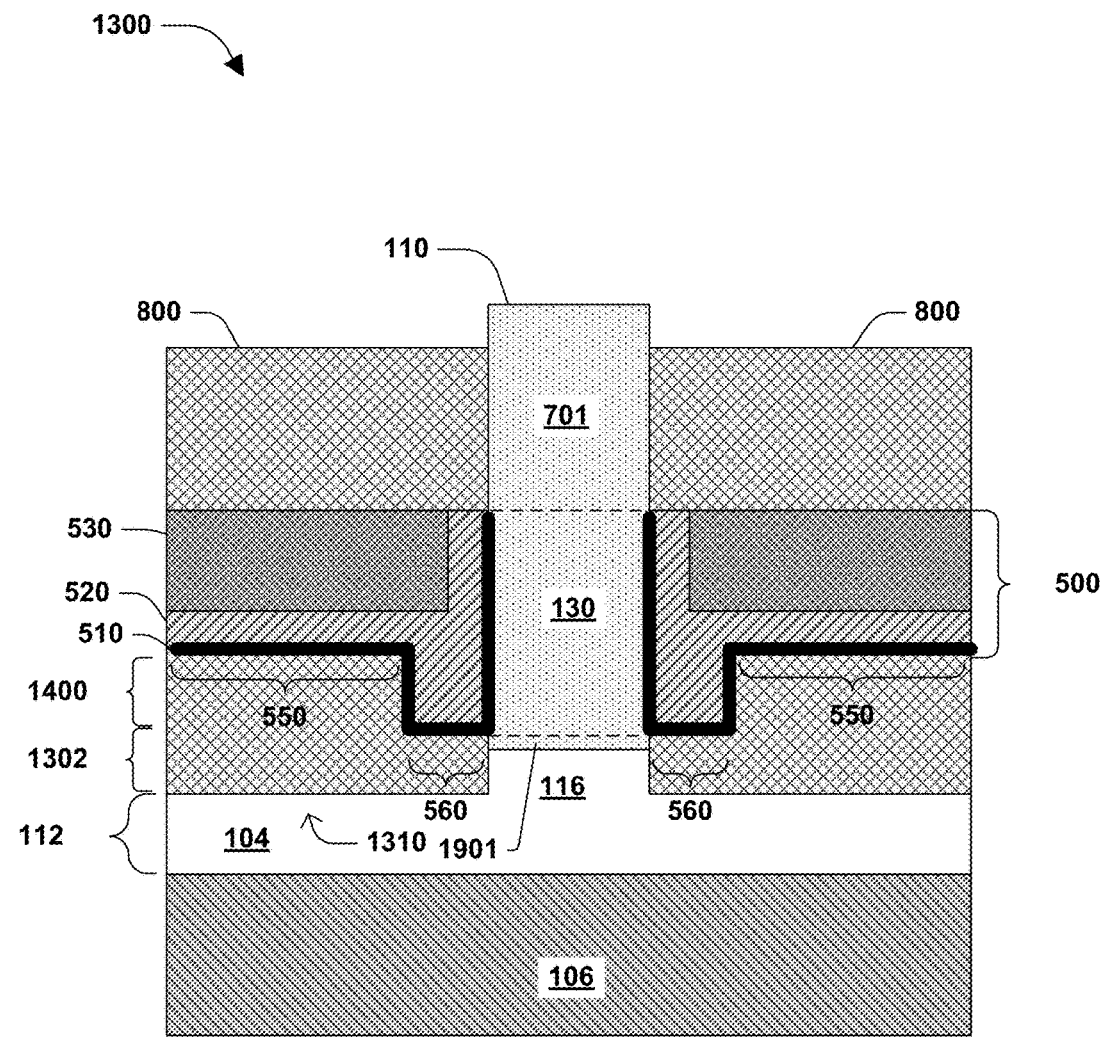
FIG. 19 illustrates a portion of a semiconductor device, according to an embodiment.

Turning to FIG. 17, in some embodiments, the insulator layer 600 is formed over the metal layer 530 of the gate region 500. In FIG. 18, in an embodiment, portions of the dielectric region 510, work function region 520, metal layer 530, and insulator layer 600 are removed, such as by etching. In FIG. 19, the second insulator layer 800 is formed over the gate region 500 and around the nanowire 110, such as around the drift region 701. In some embodiments, the gate electrode 535 comprises the work function region 520 and the metal layer 530. According to some embodiments, a second drift region 1901 (illustrated in FIG. 19) exists between the second portion 116 of the first type region 104 and the channel region 130. In some embodiments, the second drift region 1901 comprises a material or composition similar to a material or composition of the channel region 130.

Figure 20:
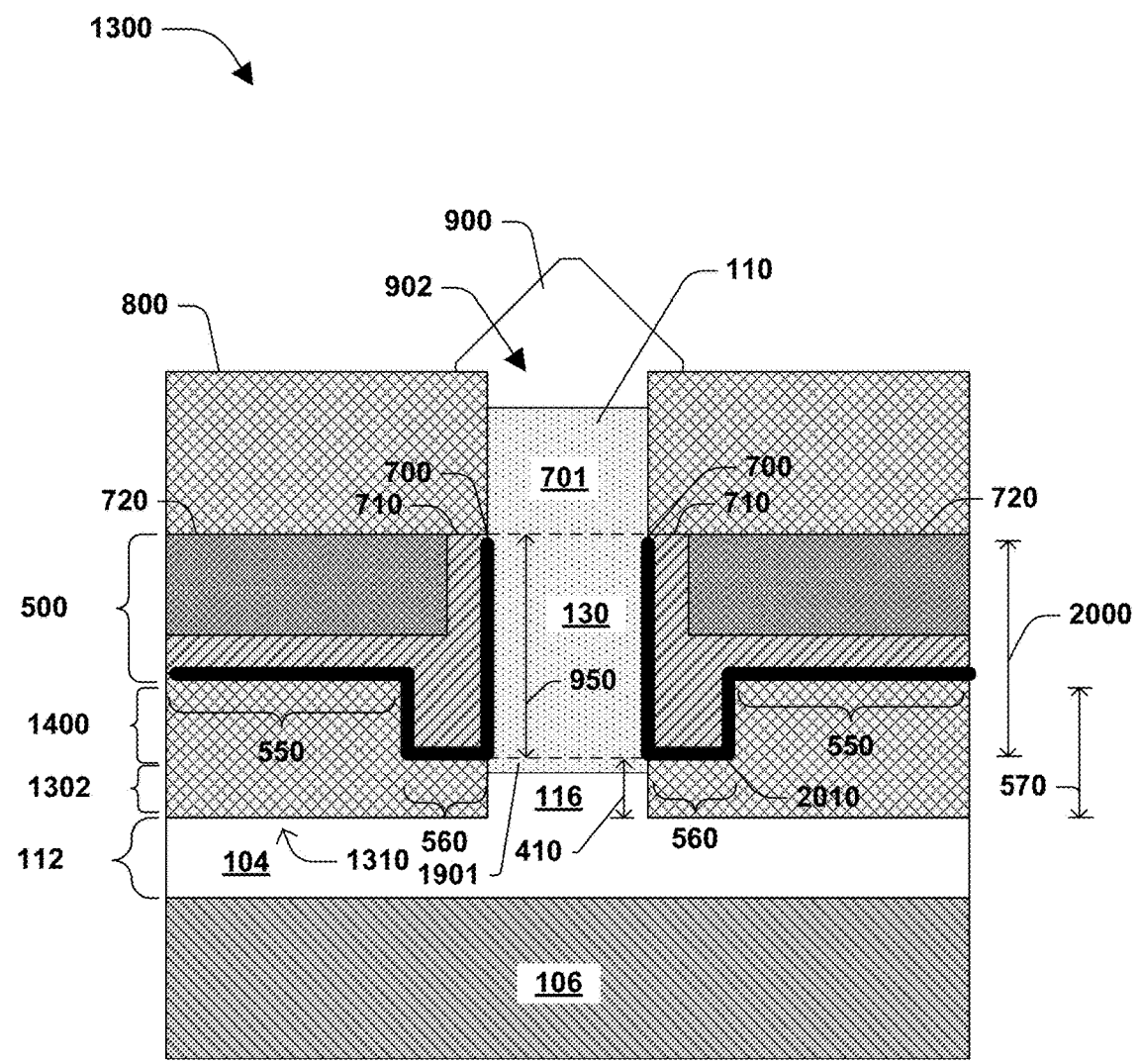
FIG. 20 illustrates forming a second type region associated with forming a semiconductor device, according to an embodiment.

Turning now to FIG. 20, the second type region 900 is formed, such as by doping the second end 902 of the nanowire 110. In some embodiments, the channel region 130 extends between the drift region 701 and the second drift region 1901. In some embodiments, the gate region 500 comprises a gate region length 2000 measured from a bottom surface 2010 of the dielectric region 510 at the second portion 560 of the gate region 500 to the top surface 700, 710, 720 of the gate region 500. In an embodiment, the channel region length 950 of the channel region 130 is substantially equal to the gate region length 2000 of the gate region 500.

Figure 21:
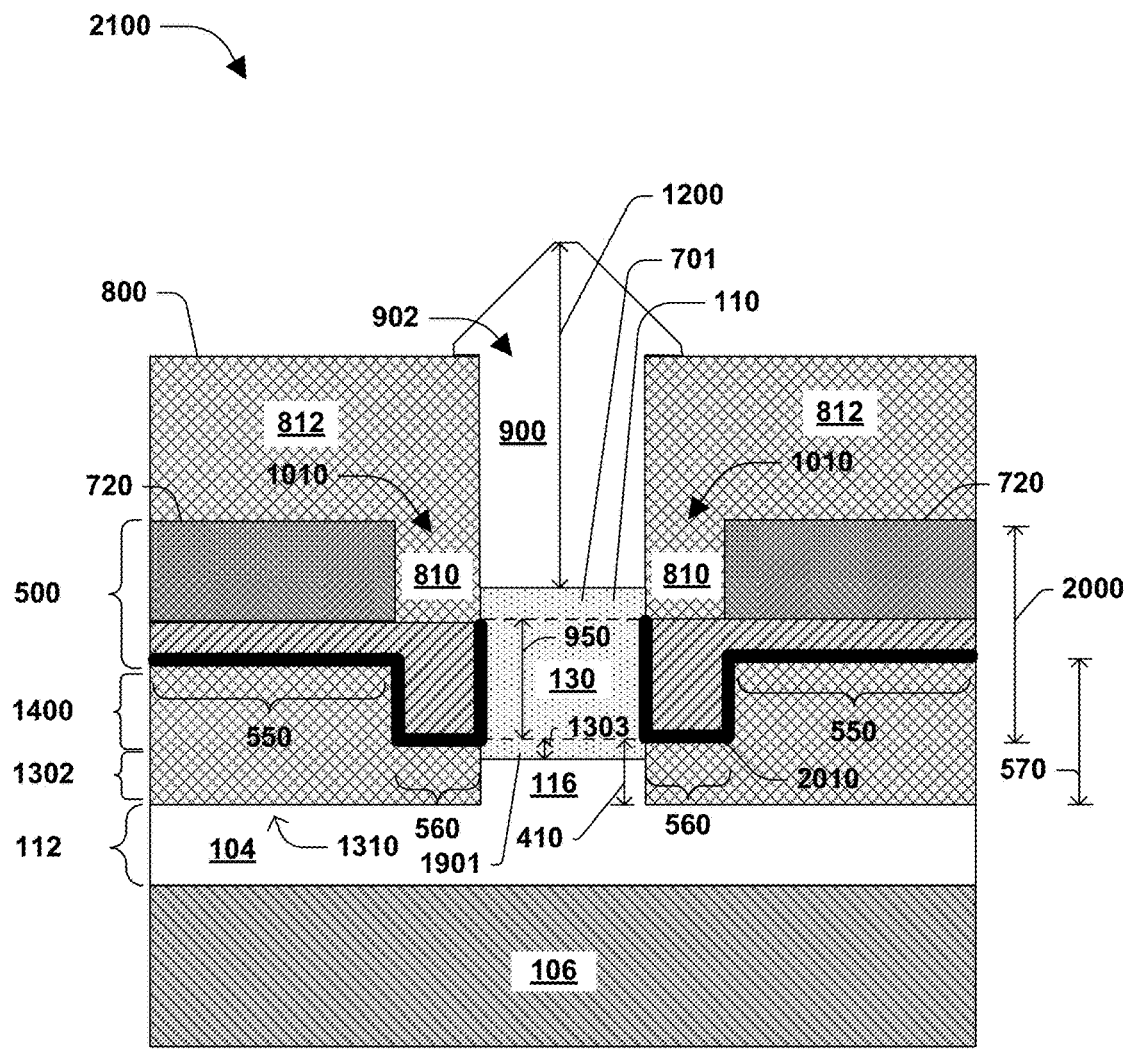
FIG. 21 illustrates a semiconductor device, according to an embodiment.

FIG. 21 illustrates an embodiment of a fourth semiconductor device 2100. According to some embodiments, the fourth semiconductor device 2100 comprises the first type region 104, substrate region 106, channel region 130, gate region 500, first insulator layer 1310, second insulator layer 800, etc. In some embodiments, the first portion 810 and second portion 812 of the second insulator layer 800 are formed in a substantially similar manner as in the second semiconductor device 1000 in FIGS. 10 to 12. In some embodiments, the first portion 1302 and second portion 1400 of the first insulator layer 1310 are formed in a substantially similar manner as in the third semiconductor device 1300 in FIGS. 13a to 20. In some embodiments, the gate region length 2000 of the gate region 500 is greater than the channel region length 950 of the channel region 130.

According to some embodiments, the semiconductor device 100, 1000, 1300, 2100 includes the channel region 130 separated the first distance 410 from the first portion 112 of the first type region 104. In some embodiments, the first portion 550 of the gate region 500 is separated the second distance 570 from the first portion 112 of the first type region 104. In some embodiments, the second distance 570 is greater than the first distance 410. According to some embodiments, electrical resistance between the first portion 112 of the first type region 104 and the channel region 130 is relatively low due to the first distance 410 being relatively short.

In some embodiments, electrical capacitance between the first portion 550 of the gate region 500 and the first portion 112 of the first type region 104 is relatively low due to the second distance 570 being greater than the first distance 410 and due to the presence of the first insulator layer 300, 1310. Additionally, in some embodiments, electrical capacitance between the second portion 560 of the gate region 500 and the first portion 112 of the first type region 104 is also relatively low due to the relatively small footprint area of the second portion 560 of the gate region 500. As such, the semiconductor device 100, 1000, 1300, 2100 provides a relatively low electrical resistance and a relatively low electrical capacitance.

Figure 22:
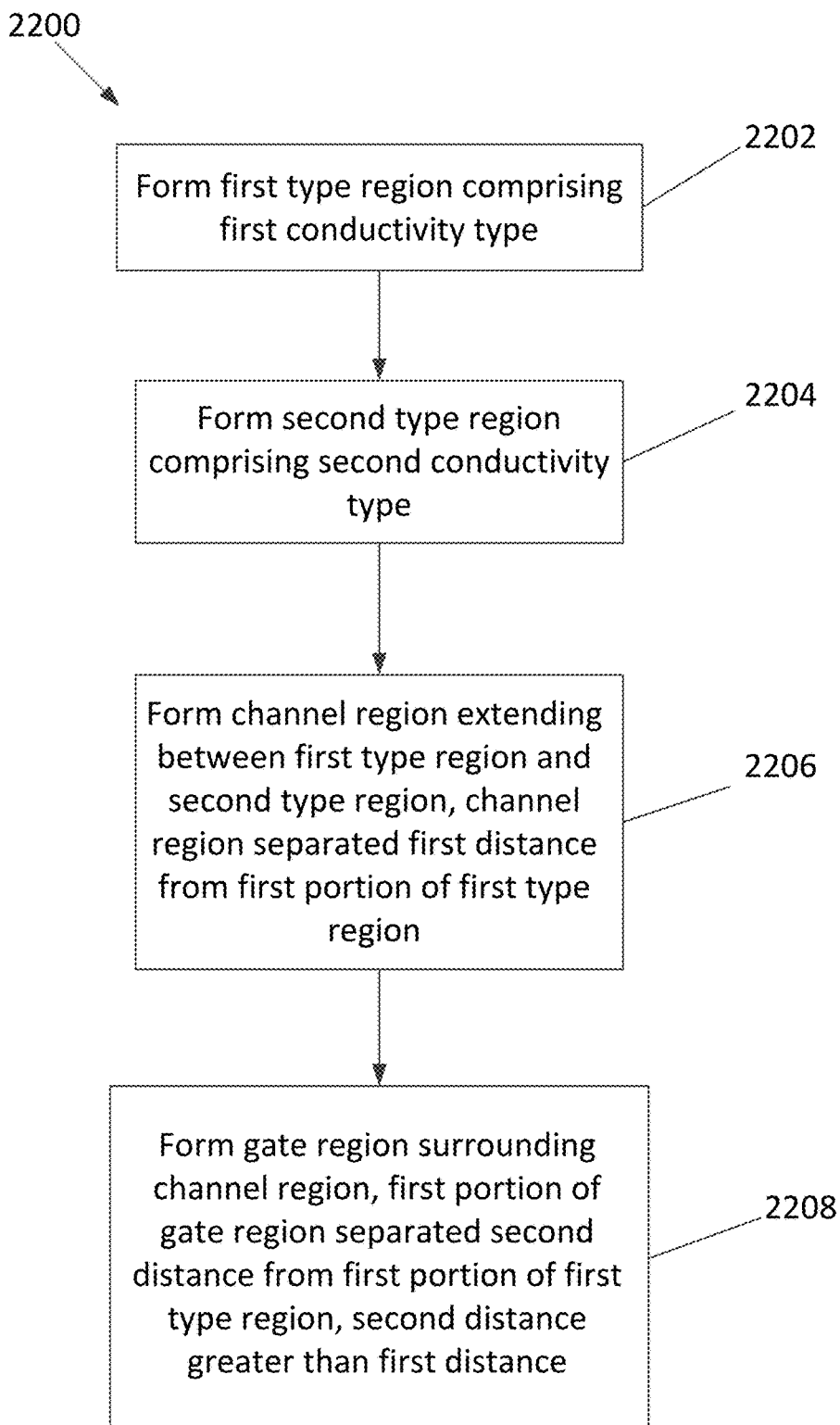
FIG. 22 illustrates a method of forming a semiconductor device, according to an embodiment.

An example method 2200 of forming a semiconductor device, such as semiconductor device 100, 1000, 1300, 2100 according to some embodiments, is illustrated in FIG. 22. At 2202, a first type region 104 is formed comprising a first conductivity type. At 2204, a second type region 900 is formed comprising a second conductivity type. At 2206, a channel region 130 is formed extending between the first type region 104 and the second type region 900. In an embodiment, the channel region 130 is separated a first distance 410 from a first portion 112 of the first type region 104. At 2208, a gate region 500 is formed surrounding the channel region 130. In an embodiment, a first portion 550 of the gate region 500 is separated a second distance 570 from the first portion 112 of the first type region 104. In an embodiment, the second distance 570 is greater than the first distance 410.

In an embodiment, a semiconductor device comprises a first type region comprising a first conductivity type. In an embodiment, the semiconductor device comprises a second type region comprising a second conductivity type. In an embodiment, a channel region extends between the first type region and the second type region. In an embodiment, the channel region is separated a first distance from a first portion of the first type region. In an embodiment, a gate region surrounds the channel region, where a first portion of the gate region is separated a second distance from the first portion of the first type region. In an embodiment, the second distance is greater than the first distance.

In an embodiment, a semiconductor device comprises a first type region comprising a first conductivity type. In an embodiment, the semiconductor device comprises a second type region comprising a second conductivity type. In an embodiment, the semiconductor device comprises a channel region extending between the first type region and the second type region. In an embodiment, the channel region is separated a first distance from a first portion of the first type region. In an embodiment, the semiconductor device comprises a gate region surrounding the channel region. In an embodiment, a first portion of the gate region is separated a second distance from the first portion of the first type region. In an embodiment, the second distance is greater than the first distance. In an embodiment, the semiconductor device comprises a first portion of a first insulator layer surrounding a second drift region below the channel region and extending between the first portion of the first type region and a second portion of the gate region.

In an embodiment, a method of forming a semiconductor device comprises forming a first type region comprising a first conductivity type. In an embodiment, the method comprises forming a second type region comprising a second conductivity type. In an embodiment, the method comprises forming a channel region extending between the first type region and the second type region, the channel region separated a first distance from a first portion of the first type region. In an embodiment, the method comprises forming a gate region surrounding the channel region. In an embodiment, a first portion of the gate region is separated a second distance from the first portion of the first type region. In an embodiment, the second distance is greater than the first distance.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first type region and a second type region generally correspond to first type region A and second type region B or two different or two identical type regions or the same type region.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
    a first source/drain region;
    a second source/drain region;
    a channel region extending between the first source/drain region and the second source/drain region; and
    a gate region comprising a gate electrode and a dielectric layer surrounding a circumference of the channel region, wherein:
        a bottom surface of a first portion of the dielectric layer is separated a first distance from a top surface of the first source/drain region that underlies the dielectric layer by an insulator layer,
        a bottom surface of a second portion of the dielectric layer is separated a second distance from the top surface of the first source/drain region by the insulator layer,
        the second distance is different than the first distance,
        the bottom surface of the first portion of the dielectric layer lies within a first plane and the bottom surface of the second portion of the dielectric layer lies within a second plane that is not co-planar with the first plane, and
        a bottom surface of a third portion of the dielectric layer disposed diametrically opposite the first portion of the dielectric layer relative to the channel region is separated the first distance from the top surface of the first source/drain region by the insulator layer.

2. The semiconductor device of claim 1, wherein the second portion of the dielectric layer is adjacent the channel region.

3. The semiconductor device of claim 1, wherein the first source/drain region and the second source/drain region have a same conductivity type.

4. The semiconductor device of claim 1, wherein a bottom surface of a fourth portion of the dielectric layer disposed diametrically opposite the second portion of the dielectric layer relative to the channel region is separated the second distance from the top surface of the first source/drain region by the insulator layer.

5. The semiconductor device of claim 1, comprising:
    a drift region overlying the channel region; and
    a second insulator layer, wherein a first portion of the second insulator layer surrounds the drift region and extends between the drift region and a metal layer of the gate electrode.

6. The semiconductor device of claim 5, wherein the drift region is in contact with the second insulator layer.

7. The semiconductor device of claim 1, wherein:
    the insulator layer abuts the first source/drain region to define a first interface,
    the insulator layer abuts the first portion of the dielectric layer to define a second interface, and
    the insulator layer abuts the second portion of the dielectric layer to define a third interface.

8. The semiconductor device of claim 7, wherein a sidewall of the dielectric layer abuts a sidewall of the first source/drain region to define a fourth interface.

* * * * *